United States Patent
Kawamura et al.

(10) Patent No.: US 6,878,470 B2
(45) Date of Patent: Apr. 12, 2005

(54) VISIBLE IMAGE RECEIVING MATERIAL, CONDUCTIVE PATTERN MATERIAL AND ORGANIC ELECTROLUMINESCENCE ELEMENT, USING MEMBER HAVING SURFACE HYDROPHILICITY

(75) Inventors: Koichi Kawamura, Shizuoka-ken (JP); Takao Nakayama, Shizuoka-ken (JP); Miki Takahashi, Shizuoka-ken (JP); Takeyoshi Kano, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 37 days.

(21) Appl. No.: 10/359,741

(22) Filed: Feb. 7, 2003

(65) Prior Publication Data

US 2003/0230967 A1 Dec. 18, 2003

(30) Foreign Application Priority Data

| Feb. 8, 2002 | (JP) | 2002-032035 |
| Feb. 8, 2002 | (JP) | 2002-032046 |
| Feb. 25, 2002 | (JP) | 2002-047834 |
| Feb. 26, 2002 | (JP) | 2002-050054 |

(51) Int. Cl.$^7$ .......................... H01J 1/62; H05B 33/00; B32B 3/10

(52) U.S. Cl. .................. 428/690; 428/32.1; 428/195.1; 428/917; 427/466; 430/315; 430/319; 430/320; 347/2; 347/105

(58) Field of Search ................................ 428/690, 32.1, 428/195.1, 917; 313/483; 430/315, 319, 320; 427/466; 347/2, 105

(56) References Cited

U.S. PATENT DOCUMENTS

| 4,725,513 A | 2/1988 | Kawada et al. |
| 2002/0023565 A1 | 2/2002 | Koichi et al. |

FOREIGN PATENT DOCUMENTS

| EP | 0 490 416 A1 | 6/1992 |
| EP | 0509109 A | 10/1992 |
| EP | 0 538 751 A1 | 4/1993 |
| EP | 0 588 407 A1 | 3/1994 |
| EP | 0 694 811 A1 | 1/1996 |
| EP | 1030383 A2 | 8/2000 |
| EP | 1087006 A | 3/2001 |
| EP | 1103590 A2 | 5/2001 |
| EP | 1 134 076 A2 | 9/2001 |
| EP | 1172696 A1 | 2/2002 |
| EP | 1282175 A2 | 2/2003 |
| JP | 7-276789 A | 10/1995 |
| JP | 10-12377 A | 1/1998 |
| JP | 10-153967 A | 6/1998 |

OTHER PUBLICATIONS

"All–wet fabrication of an organic electroluminescent device" Thin Solid Films, Elsevier–Sequoia S.A. Lausanne, Ch, vol. 388, No. 1–2, Jun. 1, 2001, pp. 256–259, XP004234780 ISSN: 0040–6090 *column 2–5*.
Japanese Abstract No. 11119413, dated Apr. 30, 1999.
Japanese Abstract No. 10296895, dated Nov. 10, 1998.

*Primary Examiner*—Dawn Garrett
(74) *Attorney, Agent, or Firm*—Sughrue Mion, PLLC

(57) ABSTRACT

The invention includes a visible image receiving material, a conductive pattern material and an organic electroluminescence element, to which a member having a hydrophilic graft chain on a surface thereof through attention to the strong hydrophilicity of the graft chain.

17 Claims, 4 Drawing Sheets

VISIBLE IMAGE RECEIVING MATERIAL, CONDUCTIVE PATTERN MATERIAL AND ORGANIC ELECTROLUMINESCENCE ELEMENT, USING MEMBER HAVING SURFACE HYDROPHILICITY

BACKGROUND OF THE INVENTION

1. Field of the Invention

The present invention relates to a visible image receiving material, a conductive pattern material and an organic electroluminescence element, which use a member having surface hydrophilicity. More particularly, the present invention relates to a visible image receiving material that is suitable for printing using an aqueous ink and excellent in coloring properties with respect to a colorant, a conductive pattern material that can conveniently form a conductive pattern and is useful for forming a circuit board, and an organic electroluminescence element that is excellent in sharpness of pixels and durability and can be conveniently subjected to uniform and local patterning.

2. Description of the Related Art

Various kinds of image receiving materials have been conventionally used in a printing apparatus using a general aqueous ink, and the image receiving materials are required to have such characteristics that an image thus formed has high chroma saturation, a colorant can be firmly fixed on the image receiving material, and the image receiving material is quick drying and does not cause ink blurring. In order to deal with such demands, the conventional image receiving materials for ink-jet recording use a polymer mordant in an image receiving layer. In this case, however, although an image thus formed has high chroma saturation and excellent transparency. there are problems such as in that absorptivity and drying speed of an ink are deteriorated, and an ink is liable to blur. Inorganic ultra-fine particles have also been used in image receiving layers, and in this case, while absorptivity and drying speed are excellent for avoiding ink blurring, there are problems such as in that an image thus formed has insufficient chroma saturation for brilliant color reproduction, and blurring occurs in the image upon storage thereof over a long period of time or under high humidity conditions.

As an example of the image receiving layer, which is excellent in physical characteristics, a colorant receiving layer having a three-dimensional network structure with a large porosity is disclosed in Japanese Patent Application Laid Open (JP-A) No. 7-276789. In this case, however, absorptivity of an ink and coloring properties in respect to a colorant are insufficient, and thus a visible image receiving material that is excellent in these characteristics is demanded.

Furthermore, various kinds of conductive pattern materials have been conventionally used for forming a circuit board. Representative examples thereof include those produced by forming a thin film of a conductive material on an insulating material by a known method, such as vacuum deposition, subjecting the thin film is subjected to a resist treatment, removing a part of the resist thus formed by pattern exposure, and then carrying out an etching treatment to form a desired pattern. Such a process requires at least four process steps, and a treating step for a waste liquid is also required in the case where a wet etching treatment is carried out. Complicated process steps are thus required.

As an example using another method for forming a pattern for a conductive pattern, a material for forming a conductive pattern by using a photoresist is known. In this method, a substrate having a photoresist polymer coated thereon or having a photoresist provided on a dry film attached thereto is exposed with UV light through an arbitrary photomask to form a pattern, such as a lattice shape, and the method is useful for forming an electromagnetic wave shield requiring high conductivity.

In recent years, a method for forming a pattern directly from digital data without use of a photomask is receiving attention as a conductive pattern material, and various kinds of proposals have been made.

It is expected that an arbitrary pattern can be conveniently formed by utilizing such digitalized pattern forming. Examples of the method include a method utilizing a self-assembling monomolecular film. This method utilizes a molecular aggregate that is spontaneously formed upon immersing a substrate in an organic solvent containing a surface active molecule, and examples thereof include a combination of an organic silane compound with an $SiO_2$ substrate or an $Al_2O_3$ substrate, and a combination of an alcohol or an amine with a platinum substrate, which can be patterned, for example, by a photolithography process. Although the monomolecular film enables formation of a fine pattern, it is necessary to use the restricted combinations of substrates and materials, and thus the method is difficult to apply in practical use. Therefore, presently, that such a technique for forming a conductive pattern, such as wiring, that can be practically applied has not yet been established.

Furthermore, research and development relating to various kinds of display elements are being actively carried out, and among them, an organic electroluminescence element (hereinafter, also referred to as an "organic EL element") is receiving attention owing to light emission of high luminance with a low voltage. In particular, the element is expected to realizing a full color display element having a large area.

To realize a full color organic EL element, it is presently necessary to arrange organic light emitting layers emitting light of three primary colors, red, green and blue, for the respective pixels, and as a production process of such a full color organic EL element, such methods as a patterning method of an EL element by a lithography process, a patterning method by vapor deposition, and a patterning method by a conventional printing method, such as screen printing, with a printing ink containing an EL material, have been employed.

However, the technique of patterning the organic light emitting layer has significant problems with regard to accuracy. The reasons therefor are as follows. The metal surface of the reflective electrode material is unstable, and thus patterning by vapor deposition fails to achieve sufficient accuracy. The polymer and the precursor for forming a positive hole injection layer and an organic light emitting layer cannot withstand patterning processes, such as photolithography.

In order to solve the aforementioned problems, JP-A No. 10-153967 discloses an EL display device capable of exerting full color display in which a resin black resist is formed between transparent pixel electrodes by a photoresist process, and light emitting materials corresponding to the respective light emitting pixels are contained in ink liquids by using the resin black resist as a partition, which is applied by the ink-jet method, as well as a production process of the EL display device.

However, because a blue light emitting material assuring durability and reliability cannot be prepared as a conventional PPV series aqueous solution precursor, organic light emitting layers of red and green colors are patterned for respective pixels by the ink-jet method, and a charge transporting organic light emitting layer of blue color is formed as an adjacent layer by a vacuum deposition method.

Furthermore, JP-A No. 10-12377 as an example of a process using no partition between pixels upon patterning the organic light emitting layers of three colors for the respective pixels by the inkjet method, discloses the following process. A positive hole injection layer is formed as an upper layer of a transparent pixel electrode formed on a glass substrate having thin film transistors formed thereon, and the organic light emitting layers corresponding to the respective pixels are formed as an upper layer of the positive hole injection layer by the ink-jet method.

However, there is a problem in accuracy of spotting ink droplets at positions of the pixels corresponding to the respective colors, and there is also a problem in that the liquid droplets are expanded and contracted during drying, whereby proper performance of the EL display cannot be exerted due to overlap of and gaps between the respective light emitting layers.

Furthermore, in the foregoing techniques, there is no particular consideration of adhesion between the organic compound layer, on which the pixels are formed, and a lower layer (such as a substrate), and therefore, there is a defect in that the organic compound layer is liable to be peeled off.

Under the circumstances described in the foregoing, it is difficult uniformly attain both sharpness and durability of the pixels and local patterning for the respective colors, in the organic EL element.

SUMMARY OF THE INVENTION

A first object of the invention is to provide a visible image receiving material that is high in absorptivity and fixing property of an ink, and is excellent in coloring property of a colorant.

A second object of the invention is to provide a conductive pattern material excellent in conductivity and durability capable of being used in a broader range of application that can provide a pattern with high resolution without complicated process steps and expensive machines even in the case where it is applied to the formation of wiring using plural different materials, and can directly form a pattern on a substrate based on digital data.

A third object of the invention is to provide an organic EL element that is excellent in sharpness and durability (adhesion strength) of pixels and can be conveniently conduct uniform and local patterning.

As a result of earnest investigations in view of the foregoing problems by the inventors, they recognize the strong hydrophilicity of a hydrophilic graft chain, and the objects of the invention can be accomplished by applying a member having the graft chain on a surface thereof (i.e., a member having surface hydrophilicity) in the visible image receiving material, the conductive pattern material and the organic EL element as a member corresponding to the characteristics thereof, whereby the invention has been completed.

Accordingly, as a result of investigations in application of the member to the visible image receiving material in view of the strong hydrophilicity of the hydrophilic graft chain, it has been found that the first object of the invention can be attained by providing an image receiving layer having the hydrophilic graft chain on a support, and thus the visible image receiving material of the invention has been completed.

In order to attain the first object of the invention, the following aspects are provided.

The invention relates to a visible image receiving material containing a support having on at least one printing surface thereof an image receiving layer having a hydrophilic graft chain.

It is preferred in the visible image receiving material of the invention that the image receiving layer comprises the hydrophilic graft chain bonded to a surface of the support or a surface of an intermediate layer provided on the support.

It is preferred in the visible image receiving material of the invention that the hydrophilic graft chain is bonded to a surface of the support or a surface of an intermediate layer provided on the support at an end of the graft chain, and a graft portion exhibiting hydrophilicity is substantially not crosslinked.

It is preferred in the visible image receiving material of the invention that the intermediate layer comprises a layer containing a compound exerting a polymerization initiating function.

It is preferred in the visible image receiving material of the invention that the image receiving layer comprises a layer that receives an aqueous ink.

It is considered that because the visible image receiving material of the invention has a hydrophilic graft chain having high mobility in the image receiving layer, it has a considerably high absorption rate of an ink, is excellent in drying speed, and shows less broadening of dots (blur), in comparison to the conventional image receiving material. Furthermore, it is considered that because the material also has such characteristics that the amount of an ink absorbed per unit area is large, it shows a high dot concentration to sharpen the colors.

In the image receiving layer having a hydrophilic graft chain in the visible image receiving material of the invention, the hydrophilic graft chain is directly bonded to the support. Therefore, upon attaching an ink to the surface thereof, the ink is ionically adsorbed to a hydrophilic group of the hydrophilic graft chain immediately and is firmly fixed thereon, to form a uniform image having a high density. As a result, even thought the image receiving layer itself is a thin layer, an image excellent in sharpness and color tone can be formed.

Accordingly, the visible image receiving material of the invention can be used as an image receiving material for various kinds of printing method using an ordinary aqueous ink. Among these, it is particularly preferably used in an apparatus using an aqueous ink having a low viscosity, such as an ink-jet recording apparatus.

As a result of earnest investigation made by the inventors paying attention on the strong ionic adsorptivity of the hydrophilic graft chain, the second object of the invention can be attained in such a manner that a member having surface hydrophilicity containing the hydrophilic graft polymer chain is used, and a conductive material is locally applied and adsorbed to the member having surface hydrophilicity, whereby the conductive pattern material of the invention has been completed.

In order to attain the second object of the invention, the following aspects are provided.

The invention relates to a conductive pattern material comprising a member having surface hydrophilicity comprising a support having at an entirety of at least one surface thereof a hydrophilic graft chain, and a conductive material layer formed thereon comprising a conductive material locally applied and adsorbed thereto.

It is preferred in the conductive pattern material of the invention that the member having surface hydrophilicity comprises the hydrophilic graft chain bonded to a surface of the support or a surface of an intermediate layer provided on the support.

It is preferred in the conductive pattern material of the invention that the hydrophilic graft chain is bonded to a surface of the support or a surface of an intermediate layer provided on the support at an end of the graft chain, and a graft portion exhibiting hydrophilicity is substantially not crosslinked.

It is preferred in the conductive pattern material of the invention that the conductive material is conductive fine particles.

It is preferred in the conductive pattern material of the invention that the conductive material layer is formed by discharging the conductive material in a fluid form from an ink-jet recording head in a pattern using an ink-jet recording apparatus, to locally apply the conductive material to the member having surface hydrophilicity.

As an embodiment of locally applying the conductive material to the member having hydrophilicity, in addition to the foregoing embodiment of discharging the conductive material in a fluid form to a pattern form by using an ink-jet recording apparatus, such embodiments are preferred in the invention, as an embodiment of forming to a film having a pattern form by using a mask pattern by the known film forming method, such as a gas phase accumulating method (gas phase method), an embodiment using the known pattern printing method, such as screen printing, and an embodiment of printing a sheet having a conductive thermal transfer layer coated thereon to a pattern form by using a heat-sensitive image forming element.

While the function of the conductive pattern material of the invention is considered as follows while it is not completely clear. The conductive pattern material of the invention uses the member having surface hydrophilicity having a hydrophilic graft polymer chain directly and chemically bonded to the support. Upon attaching a conductive material for forming wiring on the surface thereof, the conductive material is ionically adsorbed to the hydrophilic graft polymer chain through polarity mutual action based on the hydrophilic group present in the hydrophilic graft polymer chain, and the molecules adsorbed are firmly fixed in the form of a substantially monomolecular film to form a uniform layer having a high density. As a result, the layer exhibits high strength and high wear resistance even with a thin film, and thus a wiring pattern without disconnection can be formed.

Because the hydrophilic graft polymer chain in the conductive pattern material of the invention has high mobility, it has such characteristics that in comparison to the case where conductive fine particles are adsorbed on an ordinary crosslinked polymer film, the adsorption rate is significantly large, and the amount of conductive fine particles that can be adsorbed per unit area is large. Therefore, it is considered that even in the case where conductive fine particles are used as the conductive material, conductivity is not disturbed by gaps present among the fine particles to realize excellent conductivity.

Furthermore, in the case where an apparatus for locally supplying the conductive material (such as an ink-jet apparatus) is used to apply and adsorb the conductive material to the member having surface hydrophilicity, the object can be conveniently attained only with a small amount of the conductive material in comparison to the conventional method, such as a dipping method. Moreover, in the case where plural different conductive materials are to be adsorbed, the respective conductive patterns are independently formed owing to the local supply of the conductive material, and thus the patterns do not physically and chemically influence each other. Therefore, the conductive pattern material of the invention can be suitably used for sequentially forming different conductive patterns.

The inventors have also found that the third object of the invention can be attained by forming a hydrophilic surface having a hydrophilic graft chain on a substrate having an electrode previously formed thereon, and locally forming an organic light emitting layer or forming plural organic compound layers including an organic light emitting layer, on the hydrophilic surface, whereby the organic EL element of the invention has been completed.

Furthermore, the inventors have also found that the third object of the invention can be attained by forming a hydrophilic/hydrophilic region by application of energy on a substrate having an electrode previously formed thereon, and forming at least one organic compound layer including an organic light emitting layer on the surface, whereby the organic EL element of the invention has been completed.

In order to attain the third object of the invention, the following aspects are provided.

The invention relates to an organic EL element of a first embodiment comprising in the following order
    a substrate having a first electrode formed thereon,
    a hydrophilic surface having a hydrophilic graft chain provided on the substrate,
    an organic light emitting layer or plural organic compound layers including an organic light emitting layer locally provided on the hydrophilic surface, and
    a second electrode provided on the organic light emitting layer or the plural organic compound layers including an organic light emitting layer.

It is preferred in the first embodiment of the organic EL element of the invention that the hydrophilic surface contains the hydrophilic graft chain bonded to a surface of the first electrode or a surface of an intermediate layer provided on the first electrode.

It is preferred in the first embodiment of the organic EL element of the invention that the hydrophilic graft chain is bonded to a surface of the first electrode or a surface of an intermediate layer provided on the first electrode at an end of the graft chain, and a graft portion exhibiting hydrophilicity is substantially not crosslinked.

It is preferred in the first embodiment of the organic EL element of the invention that the organic compound layer is formed by discharging a composition in a fluid form for forming the organic compound layer from an ink-jet recording head in a pattern using an ink-jet recording apparatus, to locally apply the composition to the hydrophilic surface.

In the first embodiment of the organic EL element of the invention, the substrate having a surface containing a hydrophilic graft chain formed thereon are sometimes totally referred to as a "substrate material". The substrate necessarily has the first electrode, and it also may further have other elements, such as an insulating layer for distinguishing light emitting regions, a circuit.

While the function of the first embodiment of the organic EL element of the invention is considered as follows while it is not completely clear.

In the first embodiment of the organic EL element of the invention, the surface having hydrophilic graft chain directly and chemically bonded to the substrate material is provided.

Based on the function of the hydrophilic group present in the hydrophilic graft chain, the organic compound layer to be formed as an upper layer thereof is ionically adsorbed to the hydrophilic graft chain through polarity mutual action and is firmly fixed to form a uniform layer having a high density. As a result, it is considered that pixels in the organic EL element of the invention show both high hydrophilicity and high durability.

Because the hydrophilic graft chain in the invention has high mobility, it has such characteristics that in comparison to the case where the composition for forming the organic compound layer is applied to the known ordinary crosslinked polymer film, the adsorption rate is significantly large, and the amount of the composition that can be adsorbed per unit area is large. Furthermore, because the vertical permeability is also excellent, the composition for forming the organic compound layer is not diffused to the periphery but is quickly and locally permeated to the layer having the hydrophilic surface having the hydrophilic graft chain (hereinafter, which is sometimes referred to as a "hydrophilic graft layer" in the first to fourth embodiments of the organic EL element of the invention) in the vertical direction to reach the surface of the substrate material. Therefore, the organic compound layer thus formed is locally formed only on the light emitting region and can be firmly adhered to the substrate material. Accordingly, in the organic EL element of the invention, it is considered that excellent sharpness and durability are exerted by the high adhesion strength of the pixels thus realized.

In the first embodiment of the organic EL element of the invention, the following embodiment of a process for producing an organic EL element is preferred.

The preferred embodiment of a process for producing an organic EL element comprises the steps of:
   forming a first electrode on a substrate,
   forming a hydrophilic surface having a hydrophilic graft chain on the substrate having the first electrode formed thereon,
   forming an organic light emitting layer or plural organic compound layers including an organic light emitting layer locally provided on the hydrophilic surface, and
   forming a second electrode on the organic light emitting layer or the plural organic compound layers including an organic light emitting layer.

A second embodiment of the organic EL element of the invention comprises in the following order
   a substrate having a first electrode formed thereon,
   a surface at which formation of a hydrophilic/hydrophobic region by application of energy is provided on the substrate (hereinafter, also referred to as a "graft surface"),
   at least one organic compound layer including an organic light emitting layer provided on the hydrophilic region after formation thereof on the first electrode by local application of energy a surface which is formed on the substrate and is capable of forming a hydrophobic region by application of energy, and
   a second electrode provided on the organic compound layer.

A third embodiment of an organic EL element of the invention is an organic EL element of the second embodiment, in which the hydrophilic region is formed by application of heat, supply of an acid, or irradiation of a radiation ray locally on a surface having a polymer compound including a functional group whose hydrophilicity/hydrophobicity is changed by heat, an acid, or a radiation ray.

It is preferred in the organic EL element of the third embodiment of the invention that the functional group whose hydrophilicity/hydrophobicity is changed is at least one selected from the group consisting of a secondary alkylsulfonate ester group, a tertiary carboxylate ester group and an alkoxyalkyl ester group.

As the polymer compound including a functional group whose hydrophilicity/hydrophobicity is changed by heat, an acid, or a radiation ray (hereinafter, also referred to as a "polarity conversion group"), a linear polymer compound bonded to the surface provided on the substrate having the first electrode or a linear polymer compound bonded at an end of the polymer chain to the surface of the substrate by a chemical bond through a stem polymer compound is preferred.

A fourth embodiment of an organic EL element of the invention is an organic EL element of the second embodiment, in which the hydrophilic region is formed by local irradiation of a radiation ray on a surface having been in contact with a hydrophilic compound having a polymerizable group.

It is preferred in the organic EL element of the fourth embodiment that the hydrophilic region is formed on a layer containing a compound exerting a polymerization initiating function which layer is provided on the first electrode.

It is preferred in the organic EL element of the second embodiment that the organic compound layer is formed by discharging a composition in a fluid form for forming the organic compound layer from an ink-jet recording head in a pattern using an ink-jet recording apparatus, to locally apply the composition to the hydrophilic region.

In the second embodiment of the organic EL element of the invention, the substrate having the surface capable of forming a hydrophilic/hydrophobic region by application of energy is sometimes referred to as a "substrate material". The substrate necessarily has the first electrode, and it also may further have other elements, such as an insulating layer for distinguishing light emitting regions and a circuit.

In the organic EL element of the third embodiment of the invention, a hydrophilic region, a hydrophobic region and a mixed region thereof can be formed in a region having been irradiated with a radiation ray (including exposure) and a region having been heated on the substrate material corresponding to the polarity of the surface having the polymer compound having the polarity conversion group, and therefore, the organic compound layer can be selectively and locally formed only on the hydrophilic region.

The hydrophobic region can function as a partition among the pixels to improve accuracy (uniformity) upon forming the pixels. Furthermore, a partition can be formed only on the hydrophobic region.

The polymer compound having a polarity conversion group is bonded, for example, at an end thereof to the substrate material directly or through the stem polymer compound. The hydrophilic compound used in the fourth embodiment is also bonded to the substrate material by exposure. The hydrophilic region thus formed maintains high hydrophilicity and exhibits excellent durability.

The polymer compound having a polarity conversion group in the organic EL element of the third embodiment of the invention and the hydrophilic compound in the fourth embodiment has a graft chain structure having high mobility, whereby the hydrophilic region has a significantly large adsorption rate, a large water amount to be retained per unit area, and excellent vertical permeability, in comparison to the affinity of the known ordinary crosslinked polymer film with water molecules.

Therefore, upon forming the hydrophilic organic compound layer as an upper layer of the hydrophilic region, a composition for forming the organic compound layer is quickly penetrated into the layer having the polymer compound forming the hydrophilic region (hydrophilic graft polymer layer), and the organic compound layer after formation is firmly adhered to the substrate material. Accordingly, the organic EL element of the invention realizes high adhesion strength of the pixels to exert excellent durability.

Preferred examples of a process for producing the organic EL element of the invention include the following production processes (3) and (4).

The process for producing an organic EL element (3) comprises the steps of:

forming a first electrode on a substrate, forming a surface having a polymer group having a functional group whose hydrophilicity/hydrophobicity is changed by heat, an acid, or a radiation ray on the substrate having the first electrode having been formed, and applying heat, supply of an acid or irradiation with a radiation ray locally to the surface to change hydrophilicity and hydrophobicity of the surface, so as to form a hydrophilic region, forming at least one organic compound layer including an organic light emitting layer on the hydrophilic region, and forming a second electrode on the organic compound layer.

The process for producing an organic EL element (4) comprises the steps of:

forming a first electrode on a substrate, forming a surface in contact with a hydrophilic compound having a polymerizable group on the substrate having the first electrode having been formed, and locally irradiating the surface with a radiation ray to form a hydrophilic region on the first electrode, forming at least one organic compound layer including an organic light emitting layer on the hydrophilic region, and forming a second electrode on the organic compound layer.

It is preferred in the organic EL element of the invention that the organic light emitting layer or the plural organic compound layers including an organic light emitting layer is formed by an ink-jet method or a pattern printing method. Uniform and local pixels having high sharpness can be obtained by forming the organic compound layer by these methods.

BRIEF DESCRIPTION OF THE DRAWINGS

In FIG. 1, numeral 101 denotes an PET substrate, 102a denotes a transparent pixel electrode (red), 102b denotes a transparent pixel electrode (green), 102c denotes a transparent pixel electrode (blue), 103 denotes an $SiO_2$ insulating layer, 104 denotes a hydrophilic graft layer, 105a denotes an organic compound layer (red), 105b denotes an organic compound layer (green), 105c denotes an organic compound layer (blue), and 106 denotes an reflective electrode.

In FIG. 2, numeral 201 denotes a quartz substrate, 202a denotes a transparent pixel electrode (red), 202b denotes a transparent pixel electrode (green), 202c denotes a transparent pixel electrode (blue), 203 denotes a resin black resist, 204 denotes a hydrophilic graft layer, 205a denotes an organic compound layer (red), 206b denotes an organic compound layer (green), and 207c denotes an organic compound layer (blue).

In FIG. 3, numeral 301 denotes a PET substrate, 302a denotes a transparent pixel electrode (red), 302b denotes a transparent pixel electrode (green), 302c denotes a transparent pixel electrode (blue), 303 denotes an $SiO_2$ insulating layer, 304 denotes an intermediate layer, 305 denotes a graft layer, 306a denotes a hydrophilic region (red), 306b denotes a hydrophilic region (green), 306c denotes a hydrophilic region (blue), 307a denotes an organic compound layer (red), 307b denotes an organic compound layer (green), 307c denotes an organic compound layer (blue), and 308 denotes an reflective electrode.

In FIG. 4, numeral 401 denotes a quartz substrate, 402a denotes a transparent pixel electrode (red), 402b denotes a transparent pixel electrode (green), 402c denotes a transparent pixel electrode (blue), 403 denotes a resin black resist, 404 denotes an intermediate layer, 405 denotes a graft layer, 406a denotes a hydrophilic region (red), 406b denotes a hydrophilic region (green), 406c denotes a hydrophilic region (blue), 407a denotes an organic compound layer (red), 407b denotes an organic compound layer (green), 407c denotes an organic compound layer (blue), and 408 denotes an reflective electrode.

DESCRIPTION OF THE PREFERRED EMBODIMENTS

Figure 1:
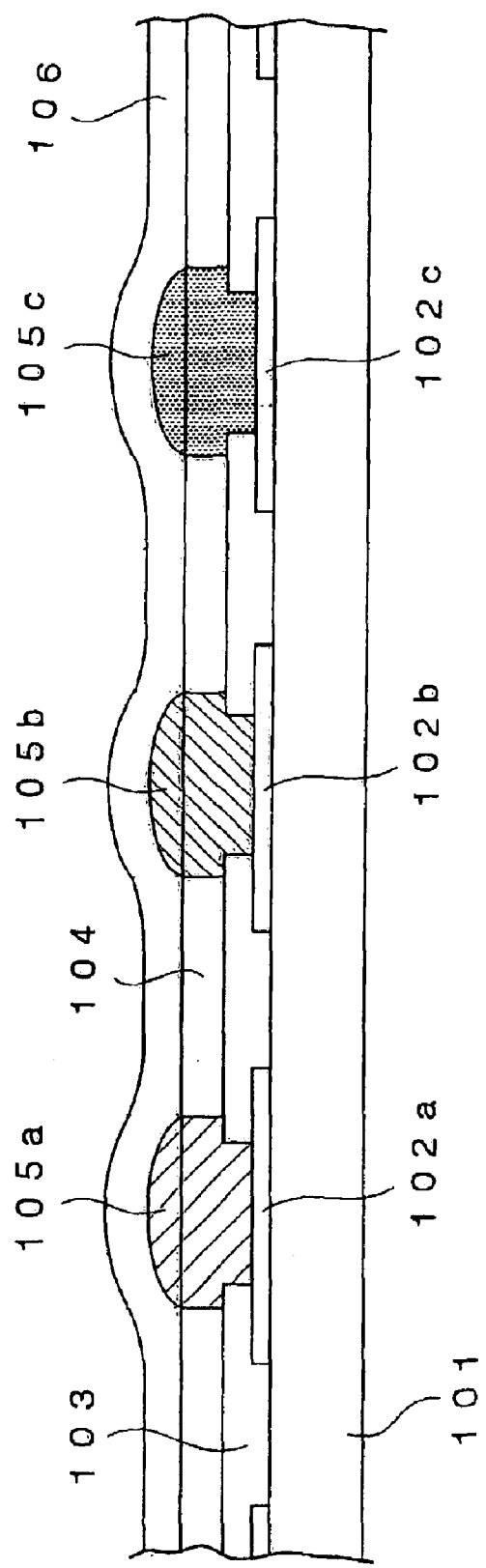
FIG. 1 is a schematic cross sectional view showing an example of the first embodiment of an organic electroluminescence element.

The invention will be described in detail below.

1. Visible Image Receiving Material

The visible image receiving material of the invention comprises a support having on at least one printing surface thereof an image receiving layer having a hydrophilic graft chain. The image receiving layer will be described.

1-1. Image Receiving Layer having Hydrophilic Graft Chain

The image receiving layer having a hydrophilic graft chain in the visible image receiving material of the invention may be formed by bonding the hydrophilic graft chain directly to the surface of the support, or may be formed by forming an intermediate layer, which is liable to be bonded to the hydrophilic graft chain, on the surface of the support, and then grafting a hydrophilic compound to the intermediate layer. Furthermore, the image receiving layer in the visible image receiving material of the invention includes those produced in such a manner that a polymer having a hydrophilic graft chain bonded to a stem polymer compound or a polymer having a hydrophilic graft chain bonded to a stem polymer compound and having a crosslinkable functional group introduced thereto is coated or coated and crosslinked to arrange the layer on the surface of the support, and those produced in such a manner that a composition containing a hydrophilic graft chain having a crosslinking group at an end thereof and a crosslinking agent is coated or coated and crosslinked to arrange the layer on the surface of the support.

The characteristic features of the hydrophilic compound in the visible image receiving material of the invention include those features that an end or a side chain of the hydrophilic graft chain is directly and chemically bonded to the surface of the support or the surface layer of the support, but the graft portion exhibiting hydrophilicity is substantially not crosslinked. According to the structure, the mobility of the graft portion exhibiting hydrophilicity is not restricted, and the graft portion is not hidden in the firm crosslinked structure, so as to maintain high mobility. It is considered therefore that excellent hydrophilicity is exhibited in comparison to an ordinary hydrophilic polymer having a crosslinked structure.

The hydrophilic graft chain generally has a weight average molecular weight Mw of from 500 to 5,000,000, preferably from 1,000 to 1,000,000, and more preferably from 2,000 to 500,000.

In the visible image receiving material of the invention, (a) an embodiment where the hydrophilic graft chain is bonded directly to the surface of the support or to an intermediate layer provided on the surface of the support is referred to as "surface graft", and (b) an embodiment where the hydrophilic graft chain is introduced into the polymer crosslinked structure is referred to as a "hydrophilic graft chain-containing crosslinked hydrophilic layer". In the invention, the support and an assembly containing the support having the intermediate layer provided thereon are referred to as a "substrate material".

1-1-1. (a) Production Method of Surface Graft

A method for producing the surface having a hydrophilic group contained in the graft chain on the substrate material includes two methods, i.e., a method of attaching the graft chain to the substrate material by a chemical bond, and a method of polymerizing a compound having a polymerizable double bond with the substrate material as the starting point to form the graft chain.

The method of attaching the graft chain to the substrate material by a chemical bond will be described.

In this method, a compound having a functional group capable of reacting with the substrate material at an end or a side chain of the graft chain is used, the functional group and a functional group on the surface of the substrate material are subjected to chemical reaction to conduct grafting. The functional group capable of reacting with the substrate material is not particularly limited as far as it can be reacted with the functional group on the surface of the substrate material, and examples thereof include a silane coupling group, such as alkoxysilane, an isocyanate group, an amino group, a hydroxyl group, a carboxyl group, a sulfonic acid group, a phosphoric acid group, an epoxy group, an allyl group, a methacryloyl group and an acryloyl group. Examples of a particularly useful compound as the polymer having the reactive functional group at an end or a side chain of the graft chain include a hydrophilic compound having a trialkoxysilyl group at an end or a side chain of the graft chain, a hydrophilic compound having an amino group at an end or a side chain of the graft chain, a hydrophilic compound having a carboxyl group at an end or a side chain of the graft chain, a hydrophilic compound having an epoxy group at an end or a side chain of the graft chain, and a hydrophilic compound having an isocyanate group at an end or a side chain of the graft chain.

The hydrophilic compound used herein is not particularly limited as far as it has hydrophilicity, specific examples thereof include polyacrylic acid, polymethacrylic acid, a polystyrenesulfonic acid, poly-2-acrylamide-2-methylpropanesulfonic acid, salts of them, polyacrylamide and polyvinylacetamide. Furthermore, a polymer of a hydrophilic monomer used in the surface graft polymerization described later and a copolymer containing a hydrophilic monomer are usefully employed.

The method of polymerizing a compound having a polymerizable double bond with the substrate material as the starting point to form the graft chain is generally referred to as surface graft polymerization. In the surface graft polymerization method, an active species is formed on the surface of the substrate material by such a manner as irradiation of a plasma, irradiation of light and heating, and a compound having a polymerizable double bond arranged to be in contact with the substrate material is polymerized to be bonded to the substrate material.

As the surface graft polymerization method for carrying out the invention, any known method described in the literatures may be used. For example, a photo-graft polymerization method and a plasma irradiation graft polymerization method are disclosed in "Shin Kobunshi Jikkengaku" (New Polymer Experimentation) 10, edited by Society of Polymer Science, Japan, p. 135. An irradiation graft polymerization method using a radiation ray, such as a γ ray and an electron beam, is described in Kyuchaku Gijutu Binran (Manual for Adsorption Technique), published by NTS Co., Ltd., supervised by Takeuchi, on February of 1999, p. 203 and 695. As a specific procedure of the photo-graft polymerization method, those methods disclosed in JP-A Nos. 63-92658, 10-296895 and 11-119413 can be employed. In the plasma irradiation graft polymerization method and the radiation ray irradiation graft polymerization method, those methods disclosed in the foregoing literatures and Y. Ikeda, et al., *Macromolecules*, vol. 19, p. 1804 (1986) can be applied.

More specifically, a surface of a polymer, such as PET, is treated with a plasma or an electron beam to generate a radical on the surface thereof, and a monomer having a hydrophilic functional group is then reacted with the active surface to obtain a graft surface layer, i.e., a surface layer having a hydrophilic group.

The photo-graft polymerization can be carried out in such a manner, in addition to those described in the foregoing literatures, that a photo-polymerizable composition is coated on a surface of a film substrate material, and the surface is then in contact with an aqueous radical polymerizable compound, followed by irradiation with light, as described in JP-A Nos. 53-17407 (Kansai Paint Co., Ltd.) and 2000-212313 (Dainippon Ink And Chemicals, Inc.).

The compound useful for forming the hydrophilic graft surface layer has a polymerizable double bond and also necessarily has a nature of hydrophilicity. As the compound, any compound including a hydrophilic polymer, a hydrophilic oligomer and a hydrophilic monomer may be used as far as the compound has a double bond in the molecule thereof. A particularly useful compound is a hydrophilic monomer.

Examples of the hydrophilic monomer useful in the visible image receiving material of the invention include a monomer having a positive charge, such as ammonium and phosphonium, and a monomer having a negative charge or a monomer capable of being dissociated to a negative charge, such as a sulfonic acid group, a carboxyl group, a phosphoric acid group and a phosphonic acid group, and in addition thereto, a hydrophilic monomer having a nonionic group, such as a hydroxyl group, an amide group, a sulfonamide group, an alkoxy group and a cyano group, may also be used.

In the visible image receiving material of the invention, specific examples of the useful hydrophilic monomer include (meth)acrylic acid and an alkali metal salt or an amine salt thereof, itaconic acid and an alkali metal salt or an amine salt thereof, allylamine and a hydrogen halide acid salt thereof, 3-vinylpropionic acid and an alkali metal salt or an amine salt thereof, vinylsulfonic acid and an alkali metal salt or an amine salt thereof, styrenesulfonic acid and an alkali metal salt or an amine salt thereof, 2-sulfoethylene (meth)acrylate, 3-sulfopropylene (meth)acrylate and an alkali metal salt or an amine salt thereof, 2-acrylamide-2-methylpropanesulfonic acid and an alkali metal salt or an amine salt thereof, acid phosphoxypolyoxyethylene glycol mono(meth)acrylate and a salt thereof, 2-dimethylaminoethyl (meth)acrylate and a hydrogen halide acid salt thereof, 3-trimethylammoniumpropyl (meth)acrylate, 3-trimethylammoniumpropyl (meth)acrylamide and N,N,N-trimethyl-N-(2-hydroxy-3-methacryloyloxypropyl)ammonium chloride. Furthermore, 2-hydroxyethyl (meth)acrylate, (meth)acrylamide, N-monomethylol (meth)acrylamide, N-dimethylol (meth)acrylamide, N-vinylpyrrolidone, N-vinylacetamide and polyoxyethylene glycol mono(meth)acrylate are also useful.

—Layer Exhibiting Polymerization Initiating Function—

Upon producing the surface graft, it is preferred to provide on the surface of the support, as an intermediate layer, a layer exhibiting a polymerization initiating function having a polymerizable compound and a polymerization initiator added thereto as a compound exhibiting a polymerization initiating function through application of energy.

The intermediate layer can be formed in such a manner that the necessary components are dissolved in a solvent capable of dissolving the components and providing on the surface of the support by such a method as coating, and the film is hardened by heating or light irradiation.

(i) Polymerizable Compound

The polymerizable compound used in the intermediate layer is not particularly limited as far as it has good adhesion property to the support and can conduct addition with the hydrophilic compound having a polymerizable group at an end and/or a side chain thereof contained in the upper layer through application of energy, such as irradiation of activation light, and a hydrophobic polymer having a polymerizable group in the molecule is preferred.

Specific examples of the hydrophobic polymer include a diene homopolymer, such as polybutadiene, polyisoprene and polypentadiene, and a homopolymer of an allyl group-containing monomer, such as allyl (meth)acrylate and 2-allyloxyethyl methacrylate;

a two-component or multi-component copolymer containing a diene monomer or an allyl group-containing monomer, such as polybutadiene, polyisoprene and polypentadiene, as a constitutional unit with styrene, a (meth)acrylate ester, (meth)acrylonitrile and the like; and a linear polymer or a three-dimensional polymer having a carbon-carbon double bond in the molecule, such as unsaturated polyester, unsaturated polyepoxide, unsaturated polyamide, unsaturated polyacryl and high density polyethylene.

The term "(meth)acryl" used herein means both or one of "acryl" and "methacryl".

The amount of the polymerizable compound in the intermediate layer is preferably from 0% to 100% by mass, and more preferably from 10% to 80% by mass, in terms of solid content.

(ii) Polymerization Initiator

In the intermediate layer of the visible image receiving material of the invention, a polymerization initiator for exhibiting a polymerization initiating function upon application of energy is preferably contained. As the polymerization initiator used herein, for example, thermal polymerization initiators and photopolymerization initiators, which have been known in the art, capable of exhibiting a polymerization initiating function upon irradiation of activation light, heating or irradiation of an electron beam can be used after appropriate selection. Among these, photopolymerization, which shows a larger reaction rate (polymerization rate) than thermal polymerization, is preferred from the standpoint of production suitability, and thus a photopolymerization initiator is preferably used.

The photopolymerization initiator used in the surface graft polymerization method by application of energy is not particularly limited as far as it is active to irradiated activation light, and can polymerize the polymerizable compound contained in the intermediate layer and the hydrophilic compound having a polymerizable group at an end or a side chain contained in the upper layer, and examples thereof include a radical polymerization initiator, an anionic polymerization initiator and a cationic polymerization initiator.

Specific examples of the photopolymerization initiators include acetophenones, such as p-tert-butyltrichloroacetophenone, 2,2'-diethoxyacetophenone and 2-hydroxy-2-methyl-1-phenylpropan-1-one; ketones, such as benzophenone, 4,4'-bisdimethylaminobenzophenone, 2-chlorothioxanthone, 2-methylthioxanthone, 2-ethylthioxanthone and 2-isopropylthioxanthone; a benzoin ethers, such as benzoin, benzoin methyl ether, benzoin isopropyl ether and benzoin isobutyl ether; and benzylketals, such as benzyldimethylketal and hydroxycyclohexylphenyl ketone.

The amount of the polymerization initiator in the intermediate layer is preferably in a range of from 0.01 to 20% by mass, and more preferably in a range of from 0.1 to 10% by mass, in terms of solid content.

A solvent used upon coating the polymerizable compound and the polymerization initiator is not particularly limited as far as it can dissolve these components. Solvents having a not too high boiling point are preferred from the standpoint of easiness of drying and workability, and those having a boiling point of about from 40 to 150° C. can be selected.

Specific examples thereof include acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate and 3-methoxypropyl acetate.

These solvents may be used solely or after mixing. The concentration of the solid contents in the coating composition is suitably from 2 to 50% by mass.

The coating amount for forming the intermediate layer on the support is preferably from 0.001 to 20 g/m$^2$, and more preferably from 0.1 to 10 g/m$^2$, in terms of the mass after drying. When the coating amount is less than 0.001 g/m$^2$, the sufficient polymerization initiating function cannot be exhibited to cause insufficient grafting of the hydrophilic compound, and thus there is a possibility to fail to obtain the desired hydrophilicity. When the coating amount exceeds 20 g/m$^2$, there is a tendency of deteriorating the film property to cause film peeling. Thus, both the cases are not preferred.

As described in the foregoing, the intermediate layer is formed in such a manner that the composition for forming the intermediate layer is arranged on the surface of the support, for example, by coating, and then the solvent is removed to form a film. At this time, the film is preferably hardened by heating and/or irradiating light. In particular, when the film is dried by heat and then preliminarily hardened by irradiation of light, it is preferred since the hardening of the polymerizable compound is previously carried out to a certain extent, whereby such a phenomenon can be effectively prevented that the intermediate layer itself is peeled off after attaining graft of the hydrophilic compound. The reason why irradiation of light is used for the preliminary hardening is the same as having been described for the photopolymerization initiator.

The conditions of the heating temperature and the heating time can be selected in such a manner that the coating solvent is sufficiently dried. It is preferred from the standpoint of production suitability that the drying temperature is 100° C. or less, and the drying time is 30 minutes or less, and it is more preferred that the drying temperature is from 40 to 80° C., and the drying time is 10 minutes or less.

Upon irradiation of light to be carried out after the heat drying, a light source used for forming the image receiving layer described later can be used. It is preferred that the irradiation of light is carried out to such an extent that the polymerizable compound present in the intermediate layer is partly radically polymerized but is not completely polymerized, from the standpoint of the formation of the image receiving layer and prevention of inhibition of the formation of the bond between the active point of the intermediate layer and the graft chain formed by application of energy. The time of the irradiation of light is preferably 30 minutes or less while it varies depending on the intensity of the light source. As a target of the preliminary hardening, for example, the film remaining ratio after solvent washing is 10% or more, and the initiator remaining ratio after the preliminary hardening is 1% or more.

(Application of Energy)

The method for applying energy upon bonding the surface graft to the intermediate layer or the support is not particularly limited as far as the method can form an active point on the surface of the substrate material, and can apply energy capable of forming a bond to the hydrophilic compound having a polymerizable group, and a method of irradiating activation light is preferred from the standpoint of simplicity of the apparatus.

Examples of the method for applying energy used for forming the hydrophilic surface in the invention include a method of heating the whole surface and a method using irradiation of a radiation ray, such as whole surface irradiation. Preferred exposure and heating conditions for applying energy to the whole surface can be appropriately selected by taking such a target into consideration that the polymerization function of the compound exhibiting the polymerization function contained in the intermediate layer is exhibited to activate the initiator.

Specific examples of the exposure and heating measure include irradiation of light, such as those using an infrared laser, an ultraviolet ray lamp and visible light, irradiation of an electron beam, such as γ ray, and application of heat energy, such as utilization of a thermal head, a heat roll and a heating zone using a non-contact heater or hot air. Examples of the light source therefor include a mercury lamp, a metal halide lamp, a xenon lamp, a chemical lamp and a carbon arc lamp. Examples of the radiation ray include, an electron beam, X ray, an ion beam and a far infrared ray. Furthermore, a g-line, an i-line, deep UV light and a high density energy beam (laser beam) may also be used.

Examples of the laser used for laser exposure include a gas laser, such as a carbon dioxide laser, a nitrogen laser, an Ar laser, a He/Ne laser, a He/Cd laser and a Kr laser, a liquid (dye) laser, a sold laser, such as a ruby laser and a Nd/YAG laser, a semiconductor laser, such as a GaAs/GaAlAs laser and an InGaAs laser, and an excimer laser, such as a KrF laser, a XeCl laser, a XeF laser and an $Ar_2$ laser. Among these, a semiconductor laser and a solid high output infrared laser, such as a YAG laser, emitting an infrared ray having a wavelength of from 700 to 1,200 nm are preferably used.

Preferred examples of specific embodiments generally employed include direct or indirect heating on the whole surface with a heating apparatus, scanning exposure with an infrared laser, and exposure on the whole surface with a high illuminance flash exposure, such as a xenon discharge lamp, and exposure with an infrared lamp.

In the case where the exposure is carried out with activation light, an ultraviolet ray and visible light are preferred, and exposure with an ultraviolet ray is particularly preferred from the standpoint that it is excellent in polymerization rate. The principal wavelength of the activation light is preferably from 250 to 800 nm.

Examples of the light source used for irradiation of an ultraviolet ray include a low pressure mercury lamp, a high pressure mercury lamp, a fluorescent lamp, a xenon lamp, a carbon arc lamp, a tungsten incandescent lamp and sunlight.

The necessary period of time for irradiation of light is generally from several seconds to 24 hours while it varies depending on the objective degree of hydrophilicity and the light source used.

According to the foregoing manner, the active point generated on the surface of the substrate material by application of energy on the whole surface of the substrate is polymerized with the hydrophilic compound having a polymerizable group to obtain a visible image receiving material having an image receiving layer containing a hydrophilic graft chain having high mobility. In a preferred embodiment, a hydrophilic compound having a polymerizable group on a side chain thereof is added, whereby the hydrophilic graft chain is bonded to the polymerizable group on the side chain of the graft chain bonded to the surface of the substrate material to form a graft chain having a branched structure. Thus, the hydrophilic graft having high mobility is exponentially improved in formation density and mobility, and therefore, higher hydrophilicity is exhibited.

1-1-2. (b) Production Process of Hydrophilic Graft Chain-containing Crosslinked Hydrophilic Layer The hydrophilic graft chain-containing crosslinked hydrophilic layer used in the visible image receiving material of the invention can be produced in such a manner that a graft chain is produced by using a method that is generally known as a synthesis method for a graft polymer, and the graft chain is crosslinked. Specific examples of the method are disclosed in "Graft Jugo to sono Oyo" (Graft Polymerization and Its Applications", by Fumio Ide, published by Kobunshi Kankokai Co., Ltd. (1977) and "Shin Kobunshi Jikkengaku" (New Polymer Experimentation) 2, Synthesis and Reaction of Polymers, edited by Society of Polymer Science, Japan, published by Kyoritsu Shuppan Co., Ltd. (1995).

The synthesis of the graft polymer is basically classified into the following three methods, i.e., (1) a branch monomer is polymerized from a stem polymer, (2) a branch polymer is bonded to a stem polymer, and (3) a branch polymer is copolymerized with a stem polymer (macromer method). The hydrophilic surface (image receiving layer) in the invention can be produced by any of the three methods, and among these, the macromer method (3) is particularly useful from the standpoint of production suitability and control of the film structure. The synthesis of the graft chain by using a macromer is disclosed in "Shin Kobunshi Jikken-gaku" (New Polymer Experimentation) 2, Synthesis and Reaction of Polymers, edited by Society of Polymer Science, Japan, published by Kyoritsu Shuppan Co., Ltd. (1995) and also disclosed in detail in "Macromonomer no Kagaku to Kogyo" (Chemistry and Industry of Macromonomers), by Yuya Yamashita, published by IPC, Ltd. (1989).

Specifically, the hydrophilic macromer can be synthesized by using the hydrophilic monomer described for the organic crosslinked hydrophilic layer, such as acrylic acid, acrylamide, 2-acrylamide-2-methylpropane sulfonate and N-vinylacetamide, according to the method disclosed in the literatures.

Particularly useful examples of the hydrophilic macromer used in the visible image receiving material of the invention include macromer derived from a monomer containing a carboxyl group, such as acrylic acid and methacrylic acid; a sulfonate-based macromer derived from a monomer, such as 2-acrylamide-2-methylpropane sulfonate and styrenesulfonic acid and salts thereof; an amide-based macromer derived from a monomer, such as acrylamide, and methacryl amide; an amide-based macromer derived from a N-vinyl carboxylic acid amide monomer, such as N-vinylacetamide and N-vinylformamide; a macromer derived from a monomer containing a hydroxyl group, such as hydroxyethyl methacrylate, hydroxyethyl acrylate and glycerol monomethacrylate; and a macromer derived from a monomer containing an alkoxy group or an ethylene oxide group, such as methoxyethyl acrylate, methoxypolyethylene glycol acrylate and polyethylene glycol acrylate. A monomer having a polyethylene glycol chain or a polypropylene glycol chain can also be usefully used as the macromer of the invention.

The useful molecular weight of the macromer is generally in a range of from 400 to 100,000, preferably in a range of from 1,000 to 50,000, and particularly preferably from 1,500 to 20,000. A molecular weight of less than 400 cannot exhibit the effect, and a molecular weight exceeding 100,000 deteriorates the polymerization property to the copolymerization monomer constituting the stem chain.

After synthesizing the hydrophilic macromer, the hydrophilic graft chain-containing crosslinked hydrophilic layer is produced, for example, by the following method. The hydrophilic macromer is copolymerized with another monomer having a reactive functional group to synthesize a graft copolymer, and then the graft copolymer thus synthesized and a crosslinking agent capable of reacting with the reactive functional group of the copolymer are coated on the support, followed by crosslinking them through reaction with heat. In another example of the method, a graft polymer having a photocrosslinkable group or a polymerizable group is synthesized, and the hydrophilic macromer and the graft polymer are coated on the support, followed by crosslinking them through reaction with irradiation with light.

Consequently, the image receiving layer having the hydrophilic graft chain can be provided on the substrate material. The thickness of the image receiving layer can be appropriately selected depending on the purposes, and in general, it is preferably in a range of from 0.001 to 10 $\mu$m, more preferably in a range of from 0.01 to 5 $\mu$m, and particularly preferably in a range of from 0.1 to 2 $\mu$m. Preferred ink receiving property and preferred ink fixing property can be obtained in the foregoing thickness range.

In the case where the hydrophilicity of the surface of the substrate material is high, it is not necessary that the whole surface of the substrate material is completely covered with the graft chain. In the case where the graft chain is introduced to the surface of the known hydrophilic substrate material, the effective hydrophilicity and ink receiving property can be exhibited by introducing the graft chain to only 0.1% or more of per the total surface area. The graft chain is more preferably introduced to 1% or more, and particularly preferably 10% or more, per the total surface area.

In another embodiment of the production of the hydrophilic surface (image receiving layer) in the visible image receiving material of the invention, the hydrophilic surface (image receiving layer) that can be applied to the visible image receiving material of the invention can be obtained in the following manner. A polymer compound including a functional group that changes the hydrophobic nature thereof to hydrophilicity by application of energy, such as heat and irradiation of a radiation ray, is provided on the support by the surface graft method described in the foregoing, and the whole surface of the support is then subjected to application of energy. This hydrophilic member can be applied to the image receiving layer of the invention and is disclosed in detail in Japanese Patent Application No. 2001-355074, which is made by the inventors and incorporated herein by reference.

1-2. Support

The support used in the visible image receiving material of the invention is a support having such a surface that the end or the side chain of the hydrophilic compound having the polymerizable group can be chemically bonded thereto directly or through the stem polymer compound. The support itself may have such characteristics, or in alternative, the intermediate layer having such characteristics may be provided on the support (substrate).

1-2-1. Support Substrate

The support substrate used in the visible image receiving material of the invention is not particularly limited and can be appropriately selected from the known materials depending on purposes. Examples thereof include films and sheets formed with such materials as paper, a synthetic polymer, a metal, a cloth and glass. Among these, films and sheets formed with paper or a synthetic polymer are generally used. Examples of the paper include pulp paper, synthetic paper formed with polypropylene or the like, mixed paper formed with a synthetic resin, such as polyethylene, and natural pulp, Yankee paper, baryta paper and coated paper (particularly cast-coat paper). Examples of the synthetic polymer include polyethylene terephthalate, polycarbonate, polyvinyl chloride, polystyrene, polypropylene, polyimide and cellulose (such as triacetyl cellulose). A pigment, such as titanium oxide, may be contained in the synthetic polymer.

The films and the sheets may be laminated with a synthetic resin, such as polyethylene, on at least one surface thereof, and may be coated with a hydrophilic binder and an antistatic agent, such as a semiconductive metallic oxide, e.g., alumina sol and tin oxide. In the invention, the supports disclosed in JP-A No. 62-253159, pages (29) to (31) can also be used in addition to the foregoing supports. The thickness of the support is not particularly limited and can be appropriately selected depending on purposes, and it is generally about from 50 to 300 $\mu$m, and preferably from 100 to 200 $\mu$m.

In the case where a metallic sheet is used as the support, the metallic sheet (such as an aluminum plate) may be subjected to the known surface treatment, such as a surface roughening treatment and an anodic oxidation treatment, depending on necessity.

In the case where a plastic film, such as a polyester film, is used, it is preferred to use those having been subjected to a surface roughening treatment from the standpoint of formability and adhesion property of the image receiving layer.

In the case where a support having a roughened surface is used, the surface property thereof preferably satisfies the following conditions.

As preferred conditions of the support having a roughened surface, in the parameters of tow-dimensional roughness, the center line average roughness (Ra) is from 0.1 to 1 μm, the maximum height (Ry) is from 1 to 10 μm, the ten-point average roughness (Rz) is from 1 to 10 μm, the average interval of irregularity (Sm) is from 5 to 80 μm, the average interval of local peaks (S) is from 5 to 80 μm, the maximum height (Rt) is from 1 to 10 μm, the center line peak height (Rp) is from 1 to 10 μm, and the center line groove depth (Rv) is from 1 to 10 μm. The roughened surface of the support preferably satisfies at least one of these conditions and more preferably satisfies all the conditions.

1-3. Aqueous Ink

An ink used for printing the visible image receiving material of the invention is not particularly limited as far as it has an aqueous nature, and various kinds of the known aqueous inks can be selected depending on purposes. Examples of an ink used in an ink-jet recording apparatus that is particularly useful for the printing means described in the foregoing will be described below, but the invention is not limited to them.

1-3-1. Solvent

An ink for ink-jet recording uses water as a liquid medium and may contain a water soluble organic solvent as a wetting agent for such purposes that the ink is prevented from drying, the dissolution stability of a colorant is improved, and the desired physical property of the ink is realized. Examples of the water soluble organic solvent include a polyhydric alcohol alkyl ether, such as ethylene glycol monoethyl ether, ethylene glycol monobutyl ether, diethylene glycol monomethyl ether, diethylene glycol monoethyl ether, diethylene glycol monobutyl ether, tetraethylene glycol monomethyl ether and propylene glycol monoethyl ether; a polyhydric alcohol aryl ether, such as ethylene glycol monophenyl ether and ethylene glycol monobenzyl ether; a polyhydric alcohol, such as ethylene glycol, diethylene glycol, triethylene glycol, polyethylene glycol, polypropylene glycol, 1,5-pentanediol, 1,6-hexanediol, glycerol, 1,2,6-hexanetriol, 1,2,4-butanetriol, 1,2,3-butanetriol and petriol; a nitrogen-containing heterocyclic compound, such as N-methyl-2-pyrrolidone, N-hydroxyethyl-2-pyrrolidone, 2-pyrrolidone, 1,3-dimethylimidazolidinone and ε-caprolactam; amides, such as formamide, N-methylformamide and N,N-dimethylformamide; a amine, such as monoethanol amine, diethanol amine, triethanol amine, monoethylamine, diethylamine and triethylamine, a sulfur-containing compound, such as dimethylsulfoxide, sulfolane thiodiethanol, propylene carbonate, ethylene carbonate, and γ-butyrolactone.

1-3-2. Colorant

As a colorant used in an ink-jet recording ink, dyes and pigments are used, and as the dyes, water soluble dyes that are excellent in water resistance and light resistance are used, which are classified into an acidic dye, a direct dye, a basic dye, a reactive dye and an edible dye in the Color Index. Specific examples of the acidic dye and the edible dye include C.I. Acid Yellow 17, 23, 42, 44, 79 and 142, C.I. Acid Red 1, 8, 13, 14, 18, 26, 27, 35, 37, 42, 52, 82, 87, 89, 92, 97, 106, 111, 114, 115, 134, 186, 249, 254 and 289, C.I. Acid Blue 9, 29, 45, 92 and 249, C.I. Acid Black 1, 2, 7, 24, 26 and 94, C.I. Food Yellow 3 and 4, C.I. Food Red 7,9 and 14, and C.I. Food Black 1 and 2, examples of the direct dye include C.I. Direct Yellow 1, 12, 24, 26, 33, 44, 50, 86, 120, 132, 142 and 144, C.I. Direct Red 1, 4, 9, 13, 17, 20, 28, 31, 39, 80, 81, 83, 89, 225 and 227, C.I. Direct Orange 26, 29, 62 and 102, C.I. Direct Blue 1, 2, 6, 15, 22, 25, 71, 76, 79, 86, 87, 90, 98, 163, 165, 199 and 202, and C.I. Direct Black 19, 22, 32, 38, 51, 56, 71, 74, 75, 77, 154, 168 and 171, examples of the basic dye include C.I. Basic Yellow 1,2, 11, 13, 14, 15, 19, 21, 23, 24, 25, 28, 29, 32, 36, 40, 41, 45, 49, 51, 53, 63, 64, 65, 67, 70, 73, 77, 87 and 91, C.I. Basic Red 2, 12, 13, 14, 15, 18, 22, 23, 24, 27, 29, 35, 36, 38, 39, 46, 49, 51, 52, 54, 59, 68, 69, 70, 73, 78, 82, 102, 104, 109 and 112, C.I. Basic Blue 1, 3, 5, 7, 9, 21, 22, 26, 35, 41, 45, 47, 54, 62, 65, 66, 67, 69, 75, 77, 78, 89, 92, 93, 105, 117, 120, 122, 124, 129, 137, 141, 147 and 155, and C.I. Basic Black 2 and 8, and examples of the reactive dye include C.I. Reactive Black 3, 4, 7, 11, 12 and 17, C.I. Reactive Yellow 1, 5, 11, 13, 14, 20, 21, 22, 25, 40, 47, 51, 55, 65 and 67, C.I. Reactive Red 1, 14, 17, 25, 26, 32, 37, 44, 46, 55, 60, 66, 74, 79, 96 and 97, and C.I. Reactive Blue 1, 2, 7, 14, 15, 23, 32, 35, 38, 41, 63, 80 and 95. Among these, the acidic dyes and the direct dyes are preferred.

Examples of a dye that is developed particularly for ink-jet recording include PROJET FAST BLACK 2, PROJET FAST MAGENTA 2, PROJET FAST YELLOW 2 and PROJET FAST CYAN 2, produced by Zeneca Corp. Examples of the pigment include an organic pigment, such as azo series, phthalocyanine series, anthraquinone series, quinacridone series, dioxiane series, indigo series, thioindigo series, perylene series, isoindolenone series, aniline black, azomethine series, a rhodamine B lake pigment and carbon black, and an inorganic pigment, such as iron oxide, titanium oxide, calcium carbonate, barium sulfate, aluminum hydroxide, barium yellow, Prussian blue, cadmium red, chromium yellow and metal powder.

1-3-3. Pigment Dispersing Agent

A pigment dispersing agent may further be added in the ink-jet recording ink, and examples of the pigment dispersing agent include a hydrophilic polymer, such as a natural compound, such as a vegetable polymer, e.g., gum arabic, gum tragacanth, gum cyamoposis, gum caraya, locust bean gum, arabino galactone, pectin and quince seed starch, a seaweed polymer, e.g., alginic acid, carrageenan and agar, an animal polymer, e.g., gelatin, casein, albumin and collagen, a microorganism polymer, e.g., xanthene gum and dextran, a semi-synthetic compound, such as a cellulose polymer, e.g., methyl cellulose, ethyl cellulose, hydroxyethyl cellulose, hydroxypropyl cellulose and carboxymethyl cellulose, a starch polymer, e.g., starch sodium glycolate and starch sodium phosphate, a seaweed polymer, e.g., sodium alginate and propylene glycol alginate ester, and a pure synthetic compound, such as a vinyl polymer, e.g., polyvinyl alcohol, polyvinyl pyrrolidone and polyvinyl methyl ether, an acrylic resin, e.g., non-crosslinked polyacrylamide, polyacrylic acid and an alkali metal salt thereof and water soluble styrene acrylic resin, a water soluble styrene-maleic acid resin, a water soluble vinylnaphthalene acrylic resin, a water soluble vinylnaphthalene-maleic acid resin, polyvinylpyrrolidone, polyvinyl alcohol, an alkali metal salt of a β-naphthalenesulfonic acid formalin condensate, a polymer compound having a cationic functional group, such as a quaternary ammonium salt and an amino group, on a side chain, and a natural polymer compound, such as shellac.

1-3-4. Other Additives

In addition to the colorant and the solvent described in the foregoing, additives having been known in the art may be added to the ink-jet recording ink. For example, examples of an antiseptic and antifungal agent include sodium dehydroacetate, sodium sorbate, sodium 2-pyridinethiol-1-oxide, sodium benzoate and sodium pentachlorophenol. Examples of a pH adjusting agent include an arbitrary substance can be used as far as it can adjust the pH to 7 or more without adverse affect on the ink thus prepared, and specific examples thereof include an amine, such as diethanolamine and triethanolamine, a hydroxide of an alkali metal, such as lithium hydroxide, sodium hydroxide and potassium hydroxide, ammonium hydroxide, quaternary ammonium hydroxide, quaternary phosphonium hydroxide, and a carbonate of an alkali metal, such as lithium carbonate, sodium carbonate and potassium carbonate. Examples of a chelating agent include sodium ethylenediamine tetraacetate, sodium nitrilotetraacetate, sodium hydroxyethylethylenediamine tetraacetate, sodium diethylenetriamine pentaacetate and sodium uramildiacetate. Examples of an antirust agent include an acidic sulfite, sodium thiosulfate, thiodiglycolic acid ammon, diisopropylammonium nitrite, pentaerythritol tetranitrate and dicyclohexylammonium nitrite. Furthermore, a water soluble ultraviolet ray absorbent and a water soluble infrared ray absorbent may also be added depending on purposes.

1-4. Printing Method

As a method for forming (printing) an image on the visible image receiving material of the invention, various kinds of the known printing methods can be used through appropriate selection depending on purposes. Examples thereof include the following embodiments.

(1) An aqueous ink is discharged from an ink-jet recording head in a pattern using an ink-jet recording apparatus.

(2) An aqueous ink is printed by a printing method using a pattern, such as screen printing and relief printing.

<(1) Embodiment Using Ink-jet Recording Apparatus>

The visible image receiving material of the invention is excellent in receiving property of an aqueous ink and is preferably used as a direct drawing type image receiving material. Therefore, it exhibit significant effect upon using as an image receiving material for printing by an ink-jet recording apparatus described in detail below.

In the ink-jet recording apparatus, pattern information of an image to be formed on the image receiving layer is supplied to the ink-jet recording apparatus from an information supplying source, such as a computer, through a transmission means, such as a bus.

As the ink-jet recording apparatus, those having an ink-jet recording head capable of discharging an ink and a control system capable of driving the recording head according to an arbitrary pattern can be used. By using the apparatus, an ink is discharged to a prescribed position on the image receiving layer from a nozzle hole (spout) of the ink-jet recording head driven according the pattern information, and thus the ink is attached according to the pattern information.

The ink-jet recording head equipped in the ink-jet recording apparatus has a cavity constituted as being capable of containing an ink charged therein, and a voltage according to an arbitrary pattern is applied to a piezoelectric element, which can induce volume change in the cavity, to change the volume of the cavity, whereby the ink charged therein is discharged from a spout in a minute droplet form, and thus is locally supplied and absorbed to the image receiving layer, followed by removing a solvent and a dispersing agent from the ink, so as to form an image.

<(2) Embodiment Using Printing Method Using Pattern>

As the printing method to the visible image receiving material of the invention, a printing method using a "pattern", such as screen printing and relief printing, can be employed in addition to the foregoing embodiment using an ink-jet recording apparatus.

The screen printing referred herein is one kind of stencil printing, in which a screen plate is produced by setting silk gauze on a wood frame and then filling mesh other than the image part with a resin, and an ink is excluded from the plate by application of pressure to attain printing.

The relief printing referred herein is such a printing method that an ink is applied to convex parts of the plate having concave parts and convex parts, and the plate is pressed to the image receiving material to transfer the ink.

Among these printing methods using a pattern, the screen printing method is particularly preferably used because a uniform image having a high density can be obtained.

The visible image receiving material of the invention can be applied to various kinds of the conventionally known printing methods, such as an ink-jet recording apparatus, as far as the method uses an aqueous ink. Even in the case where other supports than paper are used, such as a PET film and a metallic sheet, it is excellent in absorbability of an ink and coloring property to carry out printing with excellent sharpness and color tone, whereby it is expected to be applied to various purposes.

2. Conductive Pattern Material

The conductive pattern material of the invention contains a member having surface hydrophilicity containing a support having at an entirety of at least one surface thereof a hydrophilic graft chain, and a conductive material layer formed thereon containing a conductive material locally applied and adsorbed thereto.

The member having surface hydrophilicity will be described.

2-1. Member Having Surface Hydrophilicity

The member having hydrophilicity in the conductive pattern material of the invention is a member containing a support having at an entirety of at least one surface thereof a hydrophilic graft chain. That is, in the invention, the hydrophilic graft chain is present on the whole surface of the support on the side where hydrophilicity is demanded, and thus the surface exhibits uniform hydrophilicity. In the case where the requirement is satisfied, the hydrophilic graft chain may be directly bonded to the surface of the support, or in alternative, an intermediate layer, to which the graft chain can be easily bonded, is provided on the surface of the support, and then a hydrophilic compound is grafted on the intermediate layer.

Further examples of the member having surface hydrophilicity include a member obtained in such a manner that a polymer formed by bonding the hydrophilic graft chain to a stem polymer compound or a polymer obtained by bonding the hydrophilic graft chain to a stem polymer and introducing a crosslinkable functional group thereto is arranged on the surface of the support by coating or by coating and crosslinking, and a member obtained in such a manner that a composition containing the hydrophilic graft chain having a crosslinking group at an end thereof and a crosslinking agent is arranged on the surface of the support by coating or by coating and crosslinking.

In the following description of the conductive pattern material, the surface having the hydrophilic graft chain is sometimes referred to as a "hydrophilic surface".

The characteristic feature of the hydrophilic graft chain in the invention is such a structure that the end of the graft chain is bonded to the surface of the support or to the surface layer of the support, and the graft portion exhibiting hydrophilicity is substantially not crosslinked. Owing to the structure, the graft portion exhibiting hydrophilicity is not restricted in mobility and is not hidden in the firm crosslinked structure, so as to maintain high mobility. It is considered therefore that excellent hydrophilicity is exhibited in comparison to an ordinary hydrophilic polymer having a crosslinked structure.

The hydrophilic graft chain generally has a weight average molecular weight Mw of from 500 to 5,000,000, preferably from 1,000 to 1,000,000, and more preferably from 2,000 to 500,000.

In the conductive pattern material of the invention, (a) an embodiment where the hydrophilic graft polymer chain is bonded directly to the surface of the support or to an intermediate layer provided on the surface of the support is referred to as "surface graft", and (b) an embodiment where the hydrophilic graft polymer chain is introduced into the polymer crosslinked structure is referred to as a "hydrophilic graft chain-containing crosslinked hydrophilic layer". In the invention, the support and an assembly containing the support having the intermediate layer provided thereon are referred to as a "substrate material".

2-1-1. (a) Production Process of Surface Graft

In the conductive pattern material of the invention, a method for producing the surface graft includes two methods, i.e., a method of chemically attaching a functional group on the surface of the substrate material with a graft polymer, and a method of polymerizing a compound having a polymerizable double bond with the substrate material as the starting point to form the graft polymer.

As the method for producing the surface graft, the same methods as described in the chapter 1-1. Image Receiving Layer having Hydrophilic Graft Chain can be employed.

In the conductive pattern material of the invention, the layer exhibiting polymerization initiating function can be used as an intermediate layer provided on the support.

2-1-2. (b) Production Process of Hydrophilic Graft Chain-containing Crosslinked Hydrophilic Layer In the conductive pattern material of the invention, as the method for producing the hydrophilic graft polymer chain-containing crosslinked hydrophilic layer, the same methods as described in the chapter 1-1. Image Receiving Layer having Hydrophilic Graft Chain can be employed.

According to the production process, the member having surface hydrophilicity having the hydrophilic graft chain on the substrate material can be produced. The thickness of the layer forming the hydrophilic surface can be appropriately selected depending on the purposes, and in general, it is preferably in a range of from 0.001 to 10 $\mu$m, more preferably in a range of from 0.01 to 5 $\mu$m, and particularly preferably in a range of from 0.1 to 2 $\mu$m. When the thickness is too small, there is such a tendency that the flaw resistance is lowered, and when the thickness is too large, there is such a tendency that the effect of improving the adhesion property is lowered.

2-1-3. Support

The support (substrate) used in the conductive pattern material of the invention is preferably a material in a plate form having dimensional stability, and examples thereof include paper, paper laminated with plastics (such as polyethylene, polypropylene and polystyrene), a metallic plate (such as aluminum, zinc and copper), a plastic film (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinylacetal), and paper and a plastic film laminated or vapor-deposited with the foregoing metals. As the support used in the invention, a polyester film, a cellulose acetate film and an aluminum plate are preferred, and among these, a polyester film is particularly preferred.

In the conductive pattern material, an aluminum plate used as the substrate may be subjected to the known surface treatment, such as a roughening treatment and an anodic oxidation treatment, depending on necessity.

In the case where a plastic film, such as a polyester film, is used, it is preferred to use those having been subjected to a surface roughening treatment from the standpoint of formability and adhesion property of hydrophilic surface.

In the case where a support having a roughened surface is used, the surface property thereof preferably satisfies the following conditions.

As preferred conditions of the support having a roughened surface, in the parameters of tow-dimensional roughness, the center line average roughness (Ra) is from 0.1 to 1 $\mu$m, the maximum height (Ry) is from 1 to 10 $\mu$m, the ten-point average roughness (Rz) is from 1 to 10 $\mu$m, the average interval of irregularity (Sm) is from 5 to 80 $\mu$m, the average interval of local peaks (S) is from 5 to 80 $\mu$m, the maximum height (Rt) is from 1 to 10 $\mu$m, the center line peak height (Rp) is from 1 to 10 $\mu$m, and the center line groove depth (Rv) is from 1 to 10 $\mu$m. The roughened surface of the support preferably satisfies at least one of these conditions and more preferably satisfies all the conditions.

2-2. Conductive Material Layer 2-2-1. Formation of Conductive Material Layer

The conductive material layer in the conductive pattern material of the invention is formed by locally applying and adsorbing the conductive materiel described later to the member having surface hydrophilicity.

Embodiments of the formation of the conductive material layer on the member having surface hydrophilicity are not particularly limited as far as they are method capable of locally applying and adsorbing the conductive materiel described later to the member having surface hydrophilicity. For example, the following embodiments (1) to (4) are preferred.

(1) A conductive material in a fluid form is discharged from an ink-jet recording head in a pattern using an ink-jet recording apparatus.

(2) A conductive material is formed into a film by the known film forming method using a mask pattern.

(3) A conductive material is printed to a pattern form by the known printing method.

(4) A sheet having a conductive thermal transfer layer coated thereon is printed to a pattern form by using a heat-sensitive image forming element.

Among these, the embodiment using an ink-jet recording apparatus is particularly preferred from the standpoint of accuracy on supplying the conductive material to the prescribed region and controllability of the supplied amount.

2-2-3. Conductive Material

In the conductive pattern material of the invention, the conductive material that can be adsorbed on the member having surface hydrophilicity is not particularly limited as far as it has conductivity, and examples thereof include the known conductive materials, such as a metallic material, a metallic oxide semiconductor material, a semiconductor material, e.g., copper iodide, a conductive polymer, an organic conductive material, a polymer electrolyte, carbon particles and carbon fibers, which will be described later. The species and forms of these conductive materials can be appropriately selected depending on the forming method of the conductive material layer.

<(1) Embodiment of Discharging Conductive Material in a Fluid Form to Pattern Form from Ink-jet Recording Head using Inkjet Recording Apparatus>

The embodiment (1) will be described, which is the most preferred as the forming method of the conductive material layer in the conductive pattern material of the invention.

As the conductive material in this embodiment, those in a fluid form are used.

Various fluid can be used depending on purposes for forming a pattern. The fluid referred herein is not particularly limited as far as it has such fluidity that it can be discharged from an ink discharging nozzle of the ink-jet apparatus described later at an ordinary temperature (25° C.). The fluid may be oily or aqueous, or in addition to being a solution, it can be a solid material such as fine particles, or a dispersion such as latex.

For example, in the case where electrodes are to be formed as in a TFT, such fluids can be used that is produced in such a manner that the known conductive polymer, such as polyethylene dioxythiophene (PEDOT), is dissolved in a solvent to form a fluid, conductive fine particles described later are uniformly dispersed in a suitable dispersing medium, a binder is also dissolved simultaneously with the conductive fine particles, or latex is further mixed thereto.

—Conductive Fine Particles—

The conductive fine particles used in the invention are not particularly limited as far as they have conductivity and can be arbitrarily selected from fine particles of the known conductive materials. Examples thereof include metallic fine particles, such as Au, Ag, Pt, Cu, Rh, Pd, Al and Cr, oxide semiconductor fine particles, such as $In_2O_3$, $SnO_2$, ZnO, CdO, $TiO_2$, $CdIn_2O_4$, $Cd_2SnO_2$, $Zn_2SnO_4$ and $In_2O_3$—ZnO, fine particles of these material doped with an impurity that is suitable to these materials, spinel compound fine particles, such as MgInO and CaGaO, conductive nitride fine particles, such as TiN, ZrH and HfN, conductive boride fine particles, such as $LaB$, and conductive polymer fine particles as an organic material.

—Relationship between Polarity of Hydrophilic Surface and Conductive Fine Particles—

In the case where the hydrophilic surface obtained in the invention has an anionic group, such as a carboxyl group, a sulfone group or a phosphone group, the surface has a negative charge, on which conductive fine particles having a positive charge (i.e., cationic nature) are adsorbed to form a conductive region (wiring).

Examples of the conductive fine particles having a cationic nature include metallic (oxide) fine particles having a positive charge. Fine particles having a positive charge on the surface in a high density can be produced, for example, by the method disclosed in T. Yonezawa, *Chemistry Letters*, 1999, p. 1061, T. Yonezawa, *Langumuir* 2000, vol. 16, p. 5218, and T. Yonezawa, *Polymer Preprints*, Japan, vol. 49, p. 2911 (2000). Yonezawa, et al. show that a surface of metallic particles having been chemically modified in a high density with a functional group having a positive charge by utilizing a metal-sulfur bond.

On the other hand, in the case where the hydrophilic surface has a cationic group, such as an ammonium group, as described in JP-A No. 10-296895, the surface has a positive charge, on which conductive fine particles having a negative charge are adsorbed to form a conductive region (wiring). Examples of the metallic particles negatively charged include gold or silver particles obtained by citric acid reduction.

The particle diameter of the conductive fine particles used for forming the conductive material layer in the conductive pattern material of the invention is preferably in a range of from 0.1 to 1,000 nm, and more preferably in a range of from 1 to 100 nm. When the particle diameter is less than 0.1 nm, there is such a tendency that conductivity given by continuous contact of the surfaces of the fine particles is lowered. When it exceeds 1,000 nm, the adhesion strength between the hydrophilic surface and the particles is lowered, and there is such a tendency that the strength of the conductive region is deteriorated.

The conductive fine particles are preferably adsorbed in the maximum adsorption amount capable of being adsorbed on the hydrophilic group of the hydrophilic surface. The dispersion concentration in the dispersion containing the conductive fine particles is preferably about from 0.001 to 20% by mass from the standpoint of securement of conductivity.

The conductive fine particles may be used in combination of two or more kinds thereof in addition to the sole use. Furthermore, in order to obtain the prescribed conductivity, plural materials can be previously mixed and then used.

The using amount of the conductive fine particles can be appropriately selected. Because they are introduced in the substantially monomolecular form to the hydrophilic surface through ionic adsorption, they can exhibit sufficient conductivity only with a small amount in comparison to the using amount of a conductive material used in the ordinary conductive pattern material. Furthermore, such a conductive region having high sharpness can be formed that can be applied to a minute circuit.

—Ink-jet Recording Apparatus—

An ink-jet recording apparatus that is preferably used for forming the conductive material layer in the invention will be described.

In the ink-jet recording apparatus, pattern information of an image to be formed on a substrate is supplied to the ink-jet recording apparatus from an information supplying source, such as a computer, through a transmission means, such as a bus.

As the ink-jet recording apparatus, those having an ink-jet recording head capable of discharging droplets of the fluid and a control system capable of driving the recording head according to an arbitrary pattern can be used. By using the apparatus, droplets of the fluid are discharged to a prescribed position on the member having surface hydrophilicity from a nozzle hole (spout) of the ink-jet recording head driven according to the pattern information, and thus the fluid is attached according to the pattern information.

The ink-jet recording head equipped in the ink-jet recording apparatus has a cavity constituted as being capable of containing the fluid charged therein, and a voltage according to an arbitrary pattern is applied to a piezoelectric element, which can induce volume change in the cavity, to change the volume of the cavity, whereby the fluid charged therein is discharged from the spout in a minute droplet form, and thus is locally supplied and absorbed to the image receiving layer, followed by removing a solvent and a dispersing agent from the fluid, so as to form a conductive pattern.

<(2) Embodiment of Forming Conductive Material to Film by Known Film Forming Method using Mask Pattern>

The embodiment (2) that is preferably used for forming the conductive material layer in the invention will be described.

In the case where the embodiment (2) is used as the forming method of the conductive material layer in the invention, the known methods that have been used for forming a film of a conductive material can be used as the method for forming the conductive material layer. Among them, a gas phase accumulating method (gas phase method) is preferred from the standpoint of uniformity of the film obtained. The gas phase method includes a chemical vapor deposition method, (CVD) such as chemical deposition, and a physical vapor deposition method (PVD), such as a vapor deposition method and a sputtering method, and all the methods can be preferably used.

This embodiment is preferred in the case where there is an increased necessity of forming the conductive material layer as a thin film, and in the case where transparency is required for the conductive pattern material.

The thickness of the conductive material layer formed in this embodiment is not particularly limited, and in the case where transparency is not required for the conductive material layer, it is preferably in a range of about from 1 nm to 10 $\mu$m, and more preferably in a range of about from 10 nm to 1 $\mu$m.

In the case where transparency is required for the conductive material layer, the thickness is preferably in a range of about from 1 nm to 2 $\mu$m, and more preferably in a range of about from 10 nm to 1 $\mu$m. When the thickness is less than 1 $\mu$m, there is such a possibility that the conductivity is insufficient, whereas when it exceeds 2 $\mu$m, there is such a tendency that the transparency is lowered, and thus both the cases are not preferred.

As the conductive material used for forming the conductive material layer in this embodiment, those conductive materials described in the foregoing can be used without limitation as far as they can be applied to the foregoing film forming methods.

Examples of them suitable for the film formation by the gas phase method, such as a vapor deposition method and a sputtering method, include a metallic material, such as Au, Ag, Pt, Cu, Rh, Pd, Al and Cr, a metallic oxide semiconductor material, such as $In_2O_3$, $SnO_2$, ZnO, CdO, $TiO_2$, $CdIn_2O_4$, $Cd_2SnO_2$, $Zn_2SnO_4$ and $In_2O_3$—ZnO, these materials doped with an impurity that is suitable to these materials, a spinel compound, such as MgInO and CaGaO, a conductive nitride, such as TiN, ZrN and HfN, and a conductive boride, such as $LaB$.

In the case where transparency is required for the conductive patter material, preferred examples thereof include, from the standpoint of a low resistivity thereof, cost and stable availability, a metallic material, such as Pd, Au, Ag, Pt, Cu, Rh, Al and Cr, a metallic oxide semiconductor material, such as $In_2O_3$, $SnO_2$, ZnO, CdO, $TiO_2$, $CdIn_2O_4$, $Cd_2SnO_2$, $Zn_2SnO_4$ and $In_2O_3$—ZnO, indium oxide containing $SnO_2$ as a dopant (ITO) and tin oxide ($SnO_2$) containing Sb or F as a dopant.

Indium oxide in a crystalline form is excellent in transparency and conductivity and thus can be preferably used as the conductive pattern material required to have transparency. Indium oxide in an amorphous form is excellent in flexibility of the resulting film, and thus cracks are difficult to occur when a transparent resin substrate material is bent, while the resistivity is relatively high. Therefore, an amorphous ITO film may be used depending on purposes.

<(3) Embodiment of Printing Conductive Material to Pattern Form by Known Printing Method>

The embodiment (3) can also be preferably used as the forming method of the conductive material layer in the invention.

As the method for forming the conductive material layer in this embodiment, the known printing method can be applied, and for example, a screen printing method is preferably used.

As the conductive material used in this embodiment, any material can be used without particular limitation as far as it can be applied to the foregoing printing method, and for example, those exemplified for the fluid in the embodiment (1) can be used as a printing liquid.

In this embodiment using the printing method for forming the conductive material layer, the conductive pattern material can be inexpensively and conveniently obtained, and thus it is preferred particularly in the case where significantly high resolution is not demanded for the conductive pattern.

<(4) Embodiment of Printing Sheet having Conductive Thermal Transfer Layer Coated thereon to Pattern Form by using Heat-sensitive Image Forming Element>

The embodiment (4) (i.e., the embodiment where the conductive material layers formed by thermal transfer) can also be preferably used as the forming method of the conductive material layer in the invention.

In this embodiment, the conductive material is coated to a sheet in a film form to form a conductive thermal transfer layer, and it is printed as a thermal transfer material of the conductive material by using an apparatus having a heat-sensitive image forming element to form the conductive material layer.

In the production of the sheet used for transfer, specifically in the formation of the conductive material layer on a sheet, such an embodiment is preferred that the conductive material is retained on the sheet with a small amount of a binder, and according to the embodiment, the conductive material can be easily transferred with application of a slight amount of heat energy. It is preferred to use a hydrophilic resin as the binder from the standpoint of affinity to the hydrophilic surface.

The known method can be used as the method for forming the conductive material layer in this embodiment, and the known apparatus can be appropriately selected for the apparatus having a heat-sensitive image forming element. The conductive material in this embodiment is not particularly limited, and those conductive materials exemplified for the embodiment (1) that can be applied to the method and the apparatus can be selected.

The conductive pattern material of the invention can be used for various kinds of circuits, and arbitrary conductive regions can be formed by selecting the pattern forming method. Therefore, it is expected to apply a broad range of purposes including circuit formation of LSI.

Furthermore, in the case where a transparent film, such as PET, is used as the support, it can be used as a transparent conductive film having been patterned. Examples of purposes of the transparent conductive film include a transparent electrode for a display device, a dimmer device, a solar cell, a touch sensor panel and other transparent conductive film, and it is particularly useful as an electromagnetic wave filter to be attached to a CRT and a plasma display. Because the electromagnetic wave filter is required to have high conductivity and high transparency, the conductive layer is preferably formed into a grid form. The line width of the grid is preferably about from 20 to 100 $\mu$m, and the width of the opening is preferably about from 50 to 600 $\mu$m. The grid may not be regularly constituted with straight lines but may be constituted with curved lines. Because the conductive material layer having an arbitrary pattern can be conveniently formed by the invention, various kinds of setup can be attained depending on purposes.

3. Organic EL Element

3A. Organic EL Element of First Embodiment

The first embodiment of the organic EL element of the invention will be described.

The first embodiment of the organic EL element of the invention comprises in the following order a substrate having a first electrode formed thereon,
a hydrophilic surface having a hydrophilic graft chain provided on the substrate,
an organic light emitting layer or plural organic compound layers including an organic light emitting layer locally provided on the hydrophilic surface, and
a second electrode provided on the organic light emitting layer or the plural organic compound layers including an organic light emitting layer.

3A-1. Hydrophilic Surface Having Hydrophilic Graft Chain

The formation method of the hydrophilic surface having a hydrophilic graft chain provided on the substrate will be described, which is one of the characteristic features of the organic EL element of this embodiment.

The hydrophilic surface in this embodiment means a surface having a hydrophilic graft chain. The hydrophilic graft chain is preferably a hydrophilic graft polymer.

The hydrophilic surface of the embodiment may be formed by bonding the hydrophilic graft chain directly to the surface of the substrate material, or may be formed by forming an intermediate layer, which is liable to be bonded to the graft chain, on the surface of the substrate material, and then grafting a hydrophilic polymer compound to the intermediate layer. Furthermore, the hydrophilic surface in the invention includes those produced in such a manner that a polymer having a hydrophilic graft chain bonded to a stem polymer compound or a polymer having a hydrophilic graft chain bonded to a stem polymer compound and having a crosslinkable functional group introduced thereto is coated or coated and crosslinked to arrange the layer on the surface of the substrate material, and those produced in such a manner that a composition containing a hydrophilic graft chain having a crosslinking group and a crosslinking agent is coated or coated and crosslinked to arrange the layer on the surface of the substrate material.

The characteristic features of the hydrophilic graft chain in the organic EL element of the embodiment include those features that an end of the hydrophilic graft chain is bonded to the surface of the substrate material or the surface layer of the substrate material, but the graft portion exhibiting hydrophilicity is substantially not crosslinked. According to the structure, the mobility of the graft portion exhibiting hydrophilicity is not restricted, and the graft portion is not hidden in the firm crosslinked structure, so as to maintain high mobility. It is considered therefore that excellent hydrophilicity and excellent vertical permeability to a composition for forming the organic compound layer are exhibited in comparison to an ordinary hydrophilic polymer having a crosslinked structure.

The hydrophilic graft chain generally has a weight average molecular weight Mw of from 500 to 5,000,000, preferably from 1,000 to 1,000,000, and more preferably from 2,000 to 500,000.

In this embodiment, (a) an embodiment where the hydrophilic graft chain is bonded directly to the surface of the substrate material or to an intermediate layer provided on the surface of the substrate material is referred to as "surface graft", and (b) an embodiment where the hydrophilic graft polymer chain is introduced into the polymer crosslinked structure is referred to as a "hydrophilic graft chain-containing crosslinked hydrophilic layer".

3A-1-1. (a) Production Process of Surface Graft

A method for producing the hydrophilic surface having a hydrophilic graft chain on the substrate includes two methods, i.e., a method of attaching a graft polymer to a functional group on the surface the substrate material by a chemical bond, and a method of polymerizing a compound having a polymerizable double bond with the substrate material as the starting point to form the graft chain.

As the method (a) for producing the hydrophilic surface having a graft chain, the same method as having been described in "1-1. Image Receiving Layer having Hydrophilic Graft Chain" in the description for the visible image receiving material can be employed.

3A-1-2. Production Process of Hydrophilic Graft Chain-containing Crosslinked Hydrophilic Layer As the method (b) for producing the hydrophilic graft chain-containing crosslinked hydrophilic layer in the organic EL element of the embodiment, the same method as having been described in "1-1. Image Receiving Layer having Hydrophilic Graft Chain" in the description for the visible image receiving material can be employed.

3A-2. Substrate and Electrode

The substrate and the first and second electrodes of the organic EL element of the embodiment can be appropriately selected from the constitution of an organic EL element.

For example, in the case where light emission from the organic light emitting layer described later is carried out from the side of the substrate in the organic EL element, the substrate and the first electrode (anode) are preferably a transparent substrate and a transparent electrode, respectively. In this case, it is preferred that the second electrode (cathode) is a reflective electrode, or a reflective film is provided on the side of the second electrode that is not in contact with the organic compound layer.

In the case where light emission from the organic light emitting layer is carried out from the side of the second electrode (anode), on the other hand, it is preferred that the first electrode (cathode) is a reflective electrode, or in alternative, a reflective film is provided between the first electrode and the substrate. In this case, the substrate may be either transparent or opaque.

It is preferred as the constitution of the organic EL element of the invention, such a constitution is preferred that light emission from the organic light emitting layer is carried out from the side of the substrate from the standpoint of the retrieving efficiency of light.

The substrate and the first and second electrodes of the invention will be described below.

3A-2-1. Substrate

The substrate in the embodiment is not particularly limited as far as it is generally used in an organic EL element, and in view of the foregoing preferred embodiment, it is preferred to use a transparent substrate. Specifically, such a material is preferably used as glass, quartz and a transparent resin (such as polyester, polymethacrylate, polycarbonate and polysulfone). The thickness of the substrate is not particularly limited as far as it is sufficient for maintaining the mechanical strength and the thermal strength, and those having a thickness of about 10 $\mu$m or more, and preferably about from 50 $\mu$m to 1 mm, are generally used.

3A-2-2. Electrode

The first and second electrodes in the embodiment are not particularly limited as far as they are those generally used in an organic EL element. As shown by the embodiments exemplified in the foregoing, the electrodes are formed as a pair of electrodes containing an anode and a cathode.

—Anode—

The anode is to supply a positive hole to a positive hole injection layer, a positive hole transporting layer and a light emitting layer. A metal, an alloy, a metallic oxide, a conductive compound and a mixture thereof can be used, and a material having a work function of 4 eV or more is preferred.

Specific examples thereof include a conductive metallic oxide, such as tin oxide, zinc oxide, indium oxide and indium tin oxide (ITO), a metal, such as gold, silver, chromium and nickel, a mixture or an accumulated product of the metal and the conductive metallic oxide, an inorganic conductive substance, such as copper iodide and copper sulfide, an organic conductive material, such as polyaniline, polythiophene and polypyrrole, and an accumulated product of them with ITO. It is preferably a conductive metallic oxide, and ITO is particularly preferred from the standpoint of productivity, high conductivity and transparency. The thickness of the anode may be appropriately selected depending on the material, and in general, it is preferably in a range of from 5 nm to 10 $\mu$m, more preferably from 10 nm to 1 $\mu$m, and further preferably from 20 nm to 0.5 $\mu$m.

Various kinds of methods may be used for forming the anode depending on the material, and in the case of ITO, for example, it is formed into a film by an electron beam method, a sputtering method, a resistance heating vapor deposition method, a chemical reaction method (such as a sol-gel method) and a method of coating a indium tin oxide dispersion.

The anode may be subjected to a treatment, such as washing, so as to decrease the driving voltage of the element and to improve the light emitting efficiency. In the case of ITO, for example, an UV-ozone treatment and a plasma treatment are effective.

—Cathode—

The cathode is to supply an electron to an electron injection layer, an electron transporting layer and a light emitting layer and is selected under consideration of the adhesion property to the layer adjacent to the cathode, such as an electron injection layer, an electron transporting layer and a light emitting layer, the ionization potential and the stability. As the material of the cathode, a metal, an alloy, a metallic halide, a metallic oxide, a conductive compound and a mixture thereof can be used, and specific examples thereof include an alkali metal (such as Li, Na and K) and a fluoride or an oxide thereof, an alkaline earth metal (such as Mg and Ca) and a fluoride and an oxide thereof, gold, silver, lead, aluminum, a sodium-potassium alloy and a mixed metal thereof, a lithium-aluminum alloy and a mixed metal thereof, a magnesium-silver alloy and a mixed metal thereof, and a rare earth metal, such as indium and ytterbium. Among these, materials having a work function of 4 eV or less are preferred, and aluminum, a lithium-aluminum alloy and a mixed metal thereof, and a magnesium-silver alloy and a mixed metal thereof are more preferred.

The cathode may have an accumulated structure containing the compounds and the mixtures described in the foregoing, in addition to a single layer structure of the compounds and the mixture. For example, an accumulated structure of aluminum and lithium fluoride and an accumulated structure of aluminum and lithium oxide are preferred.

The thickness of the cathode may be appropriately selected depending on the material, and in general, it is preferably in a range of from 5 nm to 10 $\mu$m, more preferably from 10 nm to 1 $\mu$m, and further preferably from 20 nm to 0.5 $\mu$m.

An electron beam method, a sputtering method, a resistance heating vapor deposition method and a coating method may be used for forming the cathode. A metal may be solely vapor-deposited or two or more components thereof may be simultaneously vapor-deposited. Furthermore, an alloy electrode can be formed by simultaneously vapor-depositing plural kinds of metals or can be formed by vapor-depositing an alloy having been previously prepared.

3A-3. Organic Compound Layer

The organic compound layer in the organic EL element of the embodiment is a layer provided by forming an organic light emitting layer or plural organic layers (organic compound thin films) containing an organic light emitting layer between the first and second electrodes. The organic light emitting layer may have a single layer structure or a multi-layer structure.

3A-3-1. Organic Light Emitting Layer

The material of the organic light emitting layer may be materials capable of forming a layer having the functions including such a function that upon application of an electric field, a positive hole can be injected from an anode, a positive hole injection layer or a positive hole transporting layer, and an electron can be injected from a cathode, an electron injection layer or an electron transporting layer, such a function that the charge thus injected can be transported, and such a function that a filed for recombination of a positive hole and an electron is provided to exert light emission.

The thickness of the organic light emitting layer is not particularly limited, and in general, it is preferably in a range of from 0.01 to 5 $\mu$m, more preferably from 0.05 to 2 $\mu$m, and further preferably from 0.1 to 1 $\mu$m.

—Light Emitting Material—

As the light emitting material used in the organic light emitting layer in the invention, for example, a conjugated organic polymer compound and a precursor thereof are preferred since they are excellent in durability, and among these, polyallylenevinylene and a precursor thereof are preferred since they are excellent in workability. Examples of the polyallylenevinylene include such derivatives as poly(p-phenhlenevinylene) (PPV), poly(2,5-dimethoxy-1,4-phenhlenevinylene) (MO—PPV), poly(2,5-bishexyloxy-1,4-phenylene-(1-cyanovinylene)) (CN—PPV) and poly(2-methoxy-5-(2'-ethylhexyloxy)-p-phenylenevinylene) (MEH—PPV). A light emitting material and a dopant material, which have been known in the art, can be mixed to the foregoing materials for improving the light emission characteristics. Examples thereof include a metallic oxinoid compound (8-hydroxyquinoline metallic complex), a butadiene derivative, a coumarin derivative, a dicyanomethylenepiran derivative, a fluorescein derivative, a perylene derivative, a perynone derivative, an aminopyrene derivative, a benzoxazole derivative, an oxadiazole derivative, an oxazole derivative, a thiadiazole derivative, a stylylamine derivative, a bisstyrylbenzene derivative and a trisstyrylbenzene derivative. Furthermore, examples thereof that can be preferably used include an aromatic diamine derivative (TDP), an oxydiazole dimer (OXD), an oxidiazole derivative (PBD), a distyrylarylene derivative (DSA), a quinol metallic complex, a beryllium-benzoquinol complex (Bebq), a triphenylamine derivative (MTDATA), distyryl derivative, a pyrazoline dimer, rubrene, quinacridone, a triazole derivative, polyphenylene, polyalkylfluorene, polyalkylthiophene, an azomethine zinc complex, a porphirin zinc complex, a benzoxazole zinc complex and a phenanthroline-europium complex.

Moreover, commercially available organic liquid EL materials, produced by Cambridge Display Technologies, Inc., i.e., cyanopolyphenylenevinylene (a red light emitting material), polyphenylenevinylene (a green light emitting material) and polyphenylenevinylene and polyalkylphenylene (blue light emitting material), can also be preferably used.

3A-3-2. Layer Structure of Organic Compound Layer

As layers constituting the organic compound layer, it may have a positive hole injection layer, a positive hole transporting layer, an electron injection layer, an electron transporting layer and a protective layer, in addition to the organic light emitting layer, and these layers may respectively have another function. Various kinds of materials may be used for forming the layers.

As the forming method of the layers, such a method is preferably used in that a composition for forming the organic compound layer is locally applied to a prescribed region by an ink-jet method and a pattern printing method described later.

3A-3-3. Formation of Organic Compound Layer

The formation method of the organic EL element of the embodiment is not particularly limited, and it is preferably formed by the ink-jet method and the pattern printing method, such as a screen printing method.

—Composition for forming Organic Compound Layer—

A composition for forming the organic compound layer is used in the ink-jet method and the pattern printing method. In the case where the ink-jet method is used, the composition preferably has such fluidity that it can be discharged from an ink discharging nozzle of the ink-jet apparatus described later at an ordinary temperature (25° C.), and materials that satisfy the conditions can also be preferably used in the pattern printing method.

The composition for forming the organic compound layer is preferably a liquid containing a compound for forming the organic compound layer dissolved or dispersed in a solvent. The solvent is preferably a polar solvent from the standpoint of affinity to the hydrophilic surface.

Examples of the polar solvent include water, an alcohol solvent, such as methanol, ethanol, 1-propanol and 2-propanol, a glycol solvent (polyhydric alcohol), such as ethylene glycol and glycerin, N,N-dimethylformamide, dimethylsufoxide, dimethylimidazoline and N-methylpyrrolidone. Among these, water is preferred, and water containing a small amount of ethylene glycol or glycerin is particularly preferred. These solvents may be used solely or after mixing two or more kinds of them.

In the composition for forming the organic compound layer, additives, such as a light stabilizer, an antioxidant, a pH adjusting agent, a preservative agent and a structure stabilizer, may be added for such purposes as improvement of the durability of the organic compound layer.

—Layer Formation by Ink-jet Method—

The use of the ink-jet method in the embodiment brings about excellent performance, for example, from the standpoint that (1) a pattern can be directly formed from digital data, and (2) a layer forming material can be applied to the hydrophilic surface in both embodiments of full color and monochrome.

An ink-jet recording apparatus that can be preferably used in the embodiment will be described.

In the ink-jet recording apparatus, pattern information of the organic compound layer to be formed on the substrate material is supplied to the ink-jet recording apparatus from an information supplying source, such as a computer, through a transmission means, such as a bus.

As the ink-jet recording apparatus, those having an ink-jet recording head capable of discharging the composition for forming the organic compound layer (liquid for forming the organic compound layer) and a control system capable of driving the recording head according to an arbitrary pattern can be used. By using the apparatus, droplets of the composition for forming the organic compound layer are discharged to a prescribed position on the hydrophilic surface from a nozzle hole (spout) of the ink-jet recording head driven according to the pattern information, and thus the liquid is attached according to the pattern information.

The ink-jet recording head equipped in the ink-jet recording apparatus has a cavity constituted as being capable of containing the liquid for forming the organic compound layer charged therein, and a voltage according to an arbitrary pattern is applied to a piezoelectric element, which can induce volume change in the cavity, to change the volume of the cavity, whereby the liquid for forming the organic compound layer charged therein is discharged from a spout in a minute droplet form, and thus is locally supplied and absorbed to the hydrophilic surface, followed by removing a solvent and a dispersing agent from the liquid for forming the organic compound layer, so as to form an organic compound layer.

—Layer Formation by Pattern Printing Method—

The pattern printing method can also be preferably used for forming the organic compound layer.

As the pattern printing method, the known printing methods can be applied, and for example, a screen printing method can be preferably used.

In the case where the pattern printing method is employed, the composition for forming the organic compound layer is not particularly limited as far as it is those capable of being applied to the known printing methods, and for example, the same composition as in the ink-jet method can be used as the printing liquid.

The organic EL element can be inexpensively and conveniently obtained by using the printing method in the formation of an organic EL element of this embodiment.

3B. Organic EL Element of Second Embodiment

A second embodiment of the organic EL element of the invention will be described in detail.

The second embodiment of the organic EL element of the invention contains in the following order a substrate having a first electrode formed thereon, a surface at which formation of a hydrophilic/hydrophobic region by application of energy is provided on the substrate, at least one organic compound layer including an organic light emitting layer provided on the hydrophilic region after formation thereof on the first electrode by local application of energy to the surface, and a second electrode provided on the organic compound layer.

Preferred embodiments of the second embodiment of the invention include organic EL element of the invention include organic EL elements described below as (3C) a third embodiment and (3D) a fourth embodiment. The organic EL elements will be described below.

3C. Organic EL Element of Third Embodiment

The organic EL element of the third embodiment will be described.

The third embodiment of an organic EL element of the invention is preferably an organic EL element of the second embodiment, in which the hydrophilic region is formed by application of heat, supply of an acid, or irradiation of a radiation ray locally on a surface having a polymer compound including a functional group whose hydrophilicity/hydrophobicity is changed by heat, an acid, or a radiation ray.

3C-1. Hydrophilic Region

The hydrophilic region in the embodiment will be described.

3C-1-1. Surface Graft Polymerization

The graft surface in the embodiment is produced by such a method that is generally referred to as surface graft polymerization. The graft polymerization is such a method that active species are imparted on a polymer compound chain, and another monomer capable of initiating polymerization with the active species is polymerized to synthesize a graft polymer, and particularly, in the case where the polymer compound, to which the active species are imparted, forms a solid surface, the method is referred to as surface graft polymerization.

as the surface graft polymerization method capable of realizing the invention, any known method described in literatures can be used. for example, a photo-graft polymerization method and a plasma irradiation graft polymerization method are disclosed in "shin kobunshi jikken-gaku" (new polymer experimentation) 10, edited by society of polymer science, Japan, published by kyoritsu shuppan co., ltd., p. 135. an irradiation graft polymerization method using a radiation ray, such as a γ ray and an electron beam, is described in kyuchaku gijutu binran (manual for adsorption technique), published by nts co., ltd., supervised by takeuchi, on February of 1999, p. 203 and 695.

As a specific procedure of the photo-graft polymerization method, those methods disclosed in JP-A nos. 10-296895 and 11-119413 can be employed.

In addition to the foregoing method as a method for producing the surface graft layer having the polymer compound chain that is directly and chemically bonded at an end thereof, such a method can also be used that a reactive functional group, such as a trialkoxysilyl group, an isocyanate group, an amino group, a hydroxyl group and a carboxyl group, is applied to an end of the polymer compound chain, and a coupling reaction is carried out between the functional group and a functional group present on the surface of the substrate material.

The surface of the substrate material in the embodiment means such a surface that has a function capable of being chemically bonded to the end of the polymer compound having the polarity conversion group directly or through a stem polymer compound. It is possible that the substrate material itself has such surface characteristics, or in alternative, an intermediate layer having such characteristics is separately provided on the substrate material.

As a method for producing the surface having the end of the polymer compound chain having the polarity conversion group chemically bonded through a stem polymer compound, it is possible that a functional group capable of carrying out an coupling reaction with the functional group present on the surface of the substrate material is imparted to the side chain of the stem polymer, so as to form a graft polymer compound having the polymer compound chain having a functional group changing hydrophilicity/hydrophobicity installed as a graft chain, and a coupling reaction is carried out between the polymer and the functional group present on the substrate material or the intermediate layer.

(Functional Group Changing Hydrophilicity/Hydrophobicity)

The functional group whose hydrophilicity/hydrophobicity is changed by heat, an acid, or a radiation ray (polarity conversion group) will be described in detail.

The polarity conversion group is classified into two kinds, i.e., a functional group changing from hydrophobicity to hydrophilicity and a functional group changing from hydrophilicity to hydrophobicity.

<Functional Group changing from Hydrophobicity to Hydrophilicity>

Examples of the functional group changing from hydrophobicity to hydrophilicity include the known functional group disclosed in the literatures.

Useful examples of the functional group include an alkylsulfonate ester, disulfone and sulfonamide disclosed in JP-A No. 10-282672, an alkoxyalkyl ester disclosed in European Patent No. 652,483 and PCT international Publication No. WO92/9934, a t-butyl ester disclosed in H. Ito, et al., *Macromolecules,* vol. 21, pp. 1477, and a carboxylate ester protected with an acid-decomposing group disclosed in the literatures, such as a silyl ester and a vinyl ester.

Examples thereof also include an iminosulfonate group disclosed in M. Tsunooka, Hyomen (Surface), vol. 133, p. 374 (1995), a β-ketone sulfonate ester disclosed in M. Tsunooka, Polymer Preprints, Japan, vol. 46, pp. 2045 (1997), and a nitrobenzylsulfonate compound disclosed in A. Yamaoka, JP-A No. 63-257750. The functional group is not limited to these examples.

Among these, particularly preferred examples thereof include a secondary alkylsulfonate ester group described later, a tertiary carboxylate ester group, and an alkoxyalkyl ester group described later.

Examples of the secondary alkylsulfonate ester group particularly excellent as the functional group changing from hydrophobicity to hydrophilicity in the embodiment include the group represented by the following general formula (1).

General Formula (1)

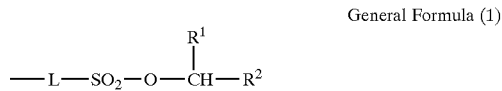

In the general formula (1), L represents an organic group containing a polyvalent non-metallic atom necessary for connecting to a polymer skeleton, and $R^1$ and $R^2$ each represents a substituted or unsubstituted alkyl group or a substituted or unsubstituted aryl group. $R^1$ and $R^2$ may be bonded to form a ring with the secondary carbon atom (CH).

$R^1$ and $R^2$ in the general formula (1) each represents a substituted or unsubstituted alkyl group or a substituted or unsubstituted aryl group, and, $R^1$ and $R^2$ may form a ring with the secondary carbon atom (CH) connecting to the groups. In the case where $R^1$ and $R^2$ each represents a substituted or unsubstituted alkyl group, examples of the alkyl group include a linear, branched or cyclic alkyl group, such as a methyl group, an ethyl group, an isopropyl group, a t-butyl group and a cyclohexyl group, and those having from 1 to 25 carbon atoms are preferably used. In the case where $R^1$ and $R^2$ each represents a substituted or unsubstituted aryl group, examples of the aryl group include a carbocyclic aryl group and a heterocyclic aryl group. Examples of the carbocyclic aryl group include those having from 6 to 19 carbon atoms, such as a phenyl group, a naphthyl group, an anthracenyl group and a pyrenyl group. Examples of the heterocyclic aryl group include those having from 3 to 20 carbon atoms and from 1 to 5 hetero atoms, such as a pyridyl group, a furyl group and groups formed by condensing a benzene ring, such as a quinolyl group, a benzofuryl group, a thioxanthone group and a carbazole group.

In the case where $R^1$ and $R^2$ each represents a substituted alkyl group or a substituted aryl group, examples of the substituent include an alkoxy group having from 1 to 10 carbon atoms, such as a methoxy group and an ethoxy group; a halogen atom, such as a fluorine atom, a chlorine atom and a bromine atom; an alkyl group substituted with a halogen atom, such as a trifluoromethyl group and a trichloromethyl group; an alkoxycarbonyl group or an aryloxycarbonyl group having from 2 to 15 carbon atoms, such as a methoxycarbonyl group, an ethoxycarbonyl group, a t-butyloxycarbonyl group and a p-chlorophenyloxycarbonyl group; a hydroxyl group; an acyloxy group, such as an acetyloxy group, a benzoyloxy group and a p-diphenylaminobenzoyloxy group; a carbonate group, such as a t-butyloxycarbonyloxy group; an ether group, such as a t-butyloxycarbonylmethyloxy group and a 2-pyranyloxy group; a substituted or unsubstituted amino group, such as an amino group, a dimethylamino group, a diphenylamino group, a morpholino group and an acetylamino group; a thioether group, such as a methylthio group and a phenylthio group; an alkenyl group, such as a vinyl group and a steryl group; a nitro group; a cyano group; a formyl group; an acyl group, such as an acetyl group and a benzoyl group; an aryl group, such as a phenyl group and a naphthyl group; and a heteroaryl group, such as a pyridyl group. In the case where $R^1$ and $R^2$ each represents a substituted aryl group, an alkyl group, such as a methyl group and an ethyl group, may also be used as the substituent in addition to the foregoing examples.

As $R^1$ and $R^2$, a substituted or unsubstituted alkyl group is preferred from the standpoint of excellent storage stability, and an alkyl group having an electron attracting group, such as an alkoxy group, a carbonyl group, an alkoxycarbonyl group, a cyano group and a halogen group, as a substituent, and an alkyl group, such as a cyclohexyl group and a norbornyl group are particularly preferred. A compound having such physical property that a chemical shift of a secondary methine hydrogen in proton NMR in chloroform-d appears at 4.4 ppm or lower magnetic field is preferred, and a compound exhibiting the chemical shift appearing at 4.6 ppm or lower magnetic field is more preferred. It is considered that the reason why the alkyl group substituted with an electron attracting group is preferred is that a carbo cation, which is considered to be formed as an intermediate upon thermal decomposition reaction, is destabilized with the electron attracting group to suppress the decomposition. Specifically, the following structures are preferred as the structure —$CHR^1R^2$.

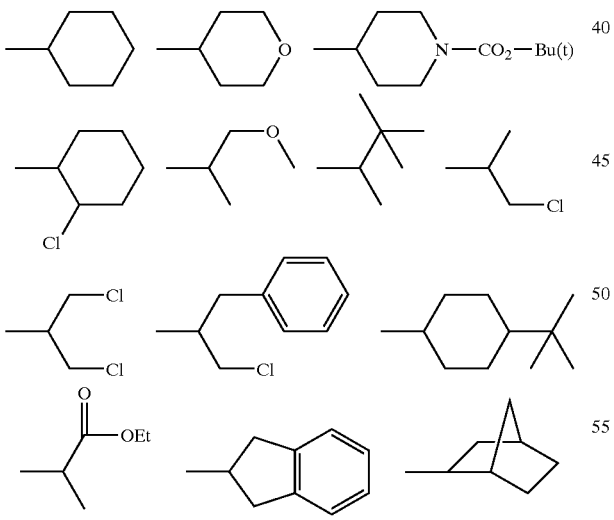

The polyvalent linking group containing a non-metallic atom represented by L in the general formula (1) is constituted with from 1 to 60 carbon atoms, from 0 to 10 nitrogen atoms, from 0 to 50 oxygen atoms, from 1 to 100 hydrogen atoms and from 0 to 20 sulfur atoms. More specific examples of the linking group include those constituted by combining the following structural units.

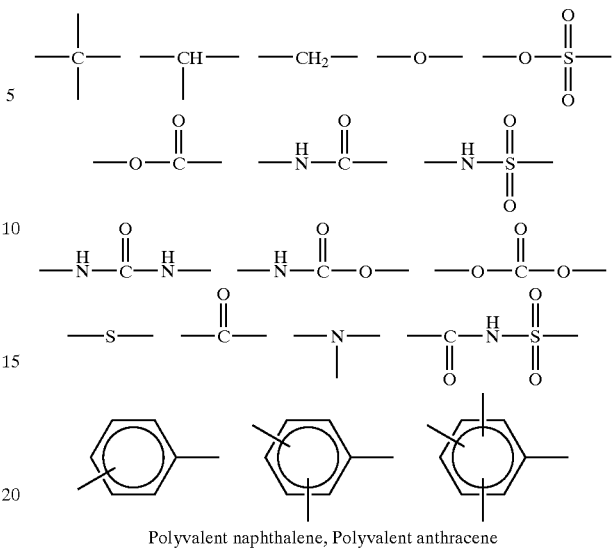

Polyvalent naphthalene, Polyvalent anthracene

In the case where the polyvalent linking group has a substituent, examples of the substituent include an alkyl group having from 1 to 20 carbon atoms, such as a methyl group and an ethyl group, an aryl group having from 6 to 16 carbon atoms, such as a phenyl group and a naphthyl group, a hydroxyl group, a carboxyl group, a sulfonamide group, an N-sulfonylamide group, an acyloxy group having from 1 to 6 carbon atoms, such as an acetoxy group, an alkoxy group having from 1 to 6 carbon atoms, such as a methoxy group and an ethoxy group, a halogen atom, such as a chlorine atom and a bromine atom, an alkoxycarbonyl group having from 2 to 7 carbon atoms, such as a methoxycarbonyl group, an ethoxycarbonyl group and a cyclohexyloxycarbonyl group, a cyano group, and a carbonate ester group, such as a t-butylcarbonate group.

Examples of an alkoxyalkyl ester group that is particularly excellent as the functional group changing from hydrophobicity to hydrophilicity in the embodiment include a group represented by the following general formula (2).

General formula (2)

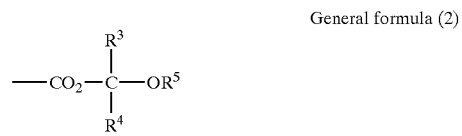

In the general formula (2), $R^3$ represents a hydrogen atom, $R^4$ represents a hydrogen atom or an alkyl group having 18 or less carbon atoms, and $R^5$ represents an alkyl group having 18 or less carbon atoms. Two of $R^3$, $R^4$ and $R^5$ may be bonded to form a ring. In particular, it is preferred that $R^4$ and $R^5$ are bonded to form a 5-membered or 6-membered ring.

As the functional group changing from hydrophobicity to hydrophilicity in the embodiment, a secondary alkylsulfonate ester group represented by the general formula (1) is particularly preferred.

Specific examples (functional groups (1) to (13)) of the functional groups represented by the general formulae (1) and (2) are shown below.

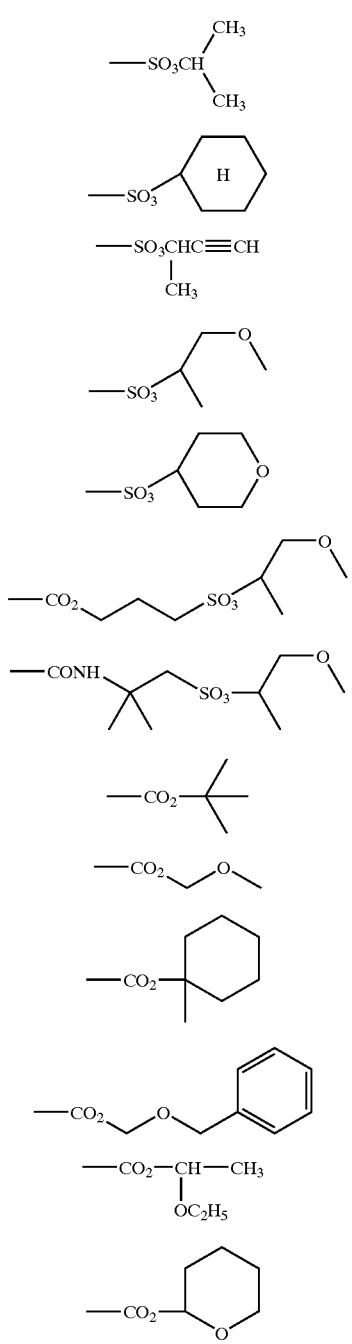

<Functional Group Changing from Hydrophilicity to Hydrophobicity>

In the case in the embodiment where it is necessary that a local hydrophobic region is formed in a hydrophilic region, a functional group changing from hydrophilicity to hydrophobicity may be used. Examples of the functional group changing from hydrophilicity to hydrophobicity with heat, an acid, or a radiation ray include the known functional groups, such as a polymer containing an onium base, particularly a polymer containing an ammonium salt, described in JP-A No. 10-296895 and U.S. Pat. No. 6,190,830. Specific examples thereof include (meth) acryloyloxyalkyltrimethylammonium. Preferred examples thereof include a carboxylic acid group and a carboxylate salt group represented by the following general formula (3). The group is not limited to these examples.

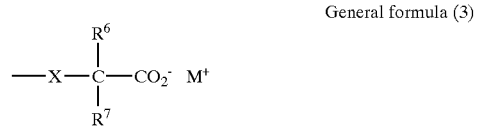

In the general formula (3), X represents —O—, —S—, —Se—, —NR$^8$—, —CO—, —SO—, —SO$_2$—, —PO—, —SiR$^8$R$^9$— and —CS—, and R$^6$, R$^7$, R$^8$ and R$^9$ each independently represents a monovalent group, and M represents an ion having positive charge.

Specific examples of R$^6$, R$^7$, R$^8$ and R$^9$ include —F, —Cl, —Br, —I, —CN, —R$^{10}$, —OR$^{10}$, —OCOR$^{10}$, —OCOOR$^{10}$, —OCONR$^{10}$R$^{11}$, —OSO$_2$R$^{10}$, —COR$^{10}$, —COOR$^{10}$, —CONR$^{10}$R$^{14}$, —NR$^{10}$R$^{11}$, —NR$^{10}$—COR$^{11}$, —NR$^{10}$—COOR$^{11}$, —NR$^{10}$—CONR$^{11}$R$^{12}$, —SR$^{10}$, —SOR$^{10}$, —SO$_2$R$^{10}$ and —SO$_3$R$^{10}$.

R$^{10}$, R$^{11}$ and R$^{12}$ each represents a hydrogen atom, an alkyl group, an aryl group, an alkenyl group or an alkynyl group.

Among these, preferred examples of R$^6$, R$^7$, R$^8$ and R$^9$ specifically include a hydrogen atom, an alkyl group, an aryl group, an alkynyl group and an alkenyl group. Specific examples of M include an ion having a positive charge described in the foregoing.

Specific examples (functional groups (14) to (31)) of the functional groups represented by the general formula (3) are shown below.

The polymer compound having the polarity conversion group in the embodiment may be either a homopolymer of one kind of a monomer having the foregoing functional group or a copolymer of two or more kinds thereof. The polymer compound may be a copolymer of another monomer unless the effect of the invention is impaired.

Specific examples of the monomer having the functional group are shown below.

(Specific Examples of Monomer Having Functional Group Represented by General Formulae (1) and (2) [Example Monomers (M-1) to (M-15)])

(Specific Examples of Monomer having Functional Group Represented by General Formula (3) [Example Monomers (M-16) to (M-33)])

M-17 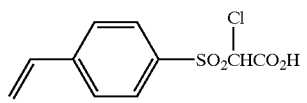

M-18 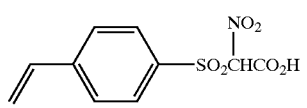

M-19 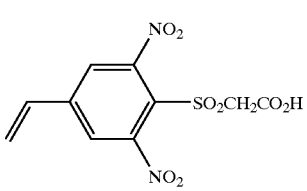

M-20 

M-21 

M-22 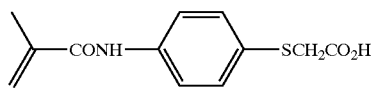

M-23 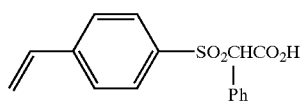

M-24 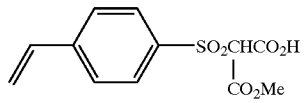

M-25 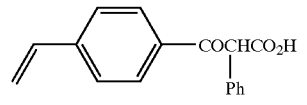

M-26 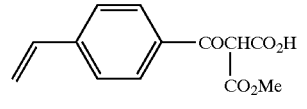

M-27 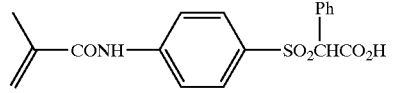

M-28 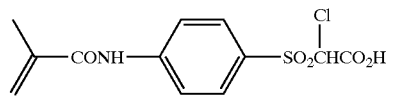

M-29 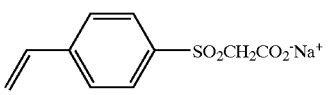

M-30 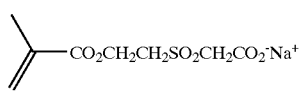

M-31 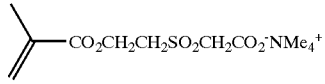

M-32 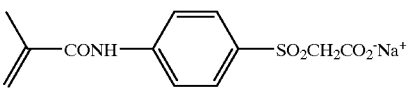

M-33 

<Functional Group Changing Hydrophilicity/Hydrophobicity With Acid>

Examples of the functional group whose hydrophilicity/hydrophobicity is changed include a functional group changing from hydrophobicity to hydrophilicity and a functional group changing from hydrophobicity to hydrophilicity, and the use of a functional group changing from hydrophobicity to hydrophilicity is advantageous in the invention in synthesis point of view. Examples of the functional group changing from hydrophobicity to hydrophilicity include the known functional groups disclosed in the literatures. Specific examples thereof include a hydroxyl group, a phenolic hydroxyl group, an amino group and a carboxyl group, which are protected with an acid-decomposing group described in T. W. Green, *Protective Group in Organic Synthesis*, A Wiley—Interscience Publication (1981). Particularly useful examples of the functional group include a carbonate ester group protected with an acid-decomposing group described in the literatures, such as an alkoxyalkyl ester described in European Patent No. 652,438 and PCT International Publication No. WO92/9934, and a t-butyl ester described in H. Ito, et al., *Macromolecules*, vol. 21, pp. 1477, as well as a silyl ester and vinyl ester. However, the functional group is not limited to these examples. Among these, particularly preferred examples thereof include a tertiary carboxylate ester group and a group represented by the general formula (2) described as an alkoxyalkyl ester group that is particularly excellent as the functional group changing from hydrophobicity to hydrophilicity.

Preferred specific examples of the functional group changing from hydrophobicity to hydrophilicity with an acid include the functional groups (11) to (13) described for specific examples of the functional group represented by the general formula (2).

—Photo Acid Generating Agent—

In the case where the functional group whose hydrophilicity/hydrophobicity is changed with an acid is introduced, it is preferred to use a photo acid generating agent, which generates an acid with light, in combination. Examples of the compound include a photoinitiator for photocationic polymerization, a photoinitiator for photoradical polymerization, a photocolor extinction agent for a colorant, a photodiscoloration agent, a compound generating an acid with light used in a microresist, and a mixture thereof, and they may be used through appropriate selection.

Specific examples thereof include diazonium salts described in S. I. Schlesinger, *Photogr. Sci. Eng.*, vol. 18, p. 387 (1974) and T. S. Bal, et al., *Polymer*, vol. 21, p. 423 (1980), ammonium salts described in U.S. Pat. Nos. 4,069,055 and 4,069,056 and JP-A No. 3-140140, phosphonium salts described in D. C. Necker, et al., *Macromolecules*, vol. 17, p. 2468 (1984), C. S. Wen, et al., *Teh Proc. Conf. Rad. Curing ASIA*, p. 478, Tokyo, Oct. (1988) and U.S. Pat. Nos.

4,069,055 and 4,069,056, iodonium salts described in J. V. Crivello, et al., *Macromolecules*, vol. 10(6), p. 1307 (1977), Chem. &, Eng. News, Nov. 28, p. 31 (1988), European Patent No. 104,143, U.S. Pat. Nos. 339,049 and 410,201, and JP-A Nos. 2-150848 and 2-296514, sulfonium salts described in J. V. Crivello, et al., *Polymer J.*, vol. 17, p. 73 (1985), J. V. Crivello, et al., *J. Org. Chem.*, vol. 43, p. 3055 (1978), W. R. Watt, et al., *J. Polymer Sci., Polymer Chem. Ed.*, vol. 22, p. 1789 (1984), J. V. Crivello, et al., *Polymer Bull.*, vol. 14, p. 279 (1985), J. V. Crivello, et al., *Macromolecules*, vol. 14(5), p. 1141 (1981), J. V. Crivello, et al., *J. Polymer Sci., Polymer Chem. Ed.*, vol. 17, p. 2877 (1979), EP-A No. 370,693, U.S. Pat. No. 3,902,114, European Patent Nos. 233,567, 297,443 and 297,442, U.S. Pat. Nos. 4,933,377, 410,201, 339,049, 4,760,013, 4,734,444 and 2,833,827, and German Patent Nos. 2,904,626, 3,604,580 and 3,604,581, selenium salts described in J. V. Crivello, et al., *Macromolecules*, vol. 10(6), p. 1307 (1977) and J. V. Crivello, et al., *J. Polymer Sci., Polymer Chem. Ed.*, vol. 17, p. 1047 (1979), onium salts, such as arsonium salts described in C. S. Wen, et al., *Teh Proc. Conf. Rad. Curing ASIA*, p. 478, Tokyo, October (1988), organic halogen compounds disclosed in U.S. Pat. No. 3,905,815, JP-B No. 46-4605, and JP-A Nos. 48-36281, 55-32070, 60-239736, 61-169835, 61-169837, 62-58241, 62-212401, 63-70243 and 63-298339, organic metal/organic halogen compounds described in K. Meier, et al., *J. Rad. Curing*, vol. 13(4), p. 26 (1986), T. P. Gill, et al., *Inorg. Chem.*, vol. 19, p. 3007 (1980), D. Astruc, *Acc. Chem. Res.*, vol. 19 (12), p. 377 (1896) and JP-A No. 2-161445, photo acid generating agents having an o-nitrobenzyl type protective group described in S. Hayase, et al., *J. Polymer Sci.*, vol. 25, p. 753 (1987), E. Reichman, et al., *J. Polymer Sci.*, Polymer Chem. Ed., vol. 23, p. 1 (1985), Q. Q. Zhu, et al., *J. Photochem.*, vol.36, 85, 39, p. 317 (1987), B. Amit, et al., *Tetrahedron Lett.*, vol. (24), p. 2205 (1973), D. H. R. Barton, et al., *J. Chem. Soc.*, p. 3571 (1965), P. M. Collins, et al., *J. Chem. Soc.*, Perkin I, p. 1695 (1975), M. Rudinstein, et al., *Tetrahedron Lett.*, vol. (17), p. 1445 (1975), J. W. Walker, et al., *J. Am. Chem. Soc.*, vol. 110, p.7170 (1988), S. C. Busman, et al., *J. Imaging Technol.*, vol.11(4) (1985), H. M. Houlihan, et al., *Macromolecules*, vol. 21, p. 2001 (1988), P. M. Collins, et al., *J. Chem. Soc., Chem. Commun.*, p. 532 (1972), S. Hayase, et al., *Macromolecules*, vol. 18, p. 1799 (1985), E. Reichmanis, et al., *J. Electrochem. Soc., Solid State Sci. Technol.*, vol. 130(6), F. M. Houlihan, et al, *Macromolecules*, vol. 21, p.2001 (1988), European Patent Nos. 290,750, 046,083, 156,535, 271,851, 388, 343, 3,901,710 and 4,181,531, and JP-A Nos. 60-198538 and 53-133022, compounds generating sulfonic acid through photodecomposition represented by an iminosulfonate described in Tsunooka, et al., *Polymer Preprints, Japan*, vol. 35(8), G. Berner, et al., *J. Rad. Curing.*, vol. 13(4), W. J. Mijs, et al., *Coating Technol.*, vol. 55(697), p. 45 (1983), Akzo, H. Adachi, et al., *Polymer Preprints*, Japan, vol. 37(3), European Patent Nos. 199,672, 84,515, 199,672, 44,115 and 101,122, U.S. Pat. Nos. 4,618,554, 4,371,605 and 4,431,774, and JP-A Nos. 64-18143, 2-245756 and 3-140109, and disulfone compounds described in JP-A No. 61-166544.

A compound having an acid generating agent introduced into a main chain or a side chain thereof can also be used, such as compounds described in E. Woodhouse, et al., *J. Am. Chem. Soc.*, vol. 104, p. 5586 (1982), S. P. Pappas, et al., *J. Imaging Sci.*, vol. 30(5), p. 218 (1986), S. Kondo, et al., *Macromol. Chem. Rapid Commun.*, vol. 9, p. 625 (1988), Y. Yamada, et al., *Macromol. Chem.*, vol. 152, 153, p. 163 (1972), J. V. Crivello, et al., J. Polymer Sci., *Polymer Chem. Ed.*, vol. 17, p. 3845 (1979), U.S. Pat. No. 3,849,137, German Patent No. 3,914,407, JP-A Nos. 63-26653, 55-164824, 62-69263, 63-14603, 63-163452, 62-153853 and 63-146029.

Furthermore, compounds generating an acid with light described in V. N. R. Pillai, Synthesis, vol. (1), p. 1 (1980), A. Abad, et al., Tetrahedron Lett., vol. (47), p. 4555 (1971), D. H. R. Barton, et al., J. Chem. Soc., vol. (C), p. 329 (1970), U.S. Pat. No. 3,779,778 and European Patent No. 126,712 can also be used.

The addition amount of the photo acid generating agent is generally about from 0.001 to 40% by mass, preferably from 0.01 to 20% by mass, and more preferably from 0.1 to 5% by mass, based on the total solid amount of the layer constituting the surface.

(Light-to-Heat Converting Substance)

In the case where the hydrophilic region is formed with an IR laser in this embodiment, it is preferred that a light-to-heat converting substance (light-to-heat converting agent) for converting light energy to thermal energy is contained. The part where the light-to-heat converting substance is contained may be, for example, either the graft layer having the surface changing hydrophilicity/hydrophobicity or the intermediate layer, and it is also possible that a light-to-heat converting substance layer is provided between the intermediate layer and the substrate material, and the substance is contained therein.

As the light-to-heat converting substance used in the organic EL element of the embodiment, any substance can be used as far as it can absorb light and convert the absorbed light to heat, and it is preferred to select such a substance that does not have absorption in the visible light region under consideration of influence on the production environment and the using environment of the organic EL element. Particularly preferred examples of the substance in the invention include a dye having a maximum absorption wavelength in a range of from 760 to 1,200 nm, which is an exposure wavelength of an infrared laser used for writing.

The dye is not particularly limited as far as it does not influence the hue of pixels, and the commercially available dyes and the known products described in the literatures (such as "Senryo Binran" (Manual for Dyes), edited by Society of Synthetic Organic Chemistry, Japan (1970).

Specific examples of the dye include an azo dye, a metallic complex azo dye, a pyrazolone azo dye, an anthraquinone dye, a phthalocyanine dye, a carbonium dye, a quinonimine dye, a methine dye, a cyanine dye and a metallic thiolate complex. Preferred examples of the dye include cyanine dyes described in JP-A Nos. 58-125246, 59-84356, 59-202829 and 60-78787, methine dyes described in JP-A Nos. 58-173696, 58-181690 and 58-194595, naphthoquinone dyes described in JP-A Nos. 58-112793, 58-224793, 59-48187, 59-73996,60-52940 and 60-63744, a squalirium dye described in JP-A No. 58-112792, and a cyanine dye described in British Patent No. 434,875.

A near infrared absorbing sensitizing agents described in U.S. Pat. No. 5,156,938 is preferably used, and a substituted arylbenzo(thio)pyrylium salt described in U.S. Pat. No. 3,881,924, a trimethyenethiapyrylium salt described in JP-A No. 57-142645 (U.S. Pat. No. 4,327,169), pyrylium compounds described in JP-A Nos. 58-181051, 58-220143, 59-41363, 59-84248, 59-84249, 59-146063 and 59-146061, a cyanine dye described in JP-A No. 59-216146, a pentamethinethiopyrylium salt described in U.S. Pat. No. 4, 283, 475, and pyrylium compounds described in JP-B Nos. 5-13514 and 5-19702 are also preferably used. Further preferred examples of the dye include near infrared absorbing dyes described in U.S. Pat. No. 4,756,993 as the formulae (I) and (II). Among these, particularly preferred examples thereof include a cyanine dye, a squalirium dye, a pyrylium salt and a nickel thiolate complex.

The dye can be used in an amount of from 0.01 to 50% by mass, preferably from 0.1 to 10% by mass, and particularly preferably from 0.5 to 10% by mass, based on the total solid content in the layer containing the light-to-heat converting substance. When the addition amount of the dye is less than 0.01% by mass, an effect of improving the sensitivity of polarity conversion is difficult to be obtained, and when it exceeds 50% by mass, the film strength of the layer containing the light-to-heat converting substance is lowered.

3C-1-2. Formation of Hydrophilic Region and Hydrophobic Region

In the embodiment, heating, supply of an acid, or irradiation of a radiation ray is locally carried out on the surface having the polymer compound having the functional group whose hydrophilicity/hydrophobicity is changed by heat, an acid, or a radiation ray thus provided, so as to form a hydrophilic/hydrophobic region. In other words, a hydrophilic region can be formed on the first electrode.

In the formation mechanism of a hydrophilic/hydrophobic region in the embodiment, the polarity conversion group of the polymer compound on the graft surface suffers polarity conversion in the region, to which heat, an acid, or irradiation of a radiation ray is applied, to form a hydrophilic region or a hydrophobic region. At this time, in the case where the region, to which heat, an acid, or irradiation of a radiation ray is applied, exhibits hydrophilicity, the hydrophobic layer maintains the original surface condition and remains as a hydrophobic region in the region, to which heat, an acid, or irradiation of a radiation ray is not applied. In the case where the region, to which heat, an acid, or irradiation of a radiation ray is applied, becomes a hydrophobic region, the hydrophilic layer maintains the original surface condition and remains as a hydrophilic region in the region, to which heat, an acid, or irradiation of a radiation ray is not applied.

The local formation of a hydrophilic/hydrophobic region is carried out by irradiation of a radiation ray, such as light, or by heating. In the case of an embodiment using the light-to-heat converting substance is used in combination as one embodiment of light irradiation, a hydrophilic/hydrophobic region can be formed by heating by scanning exposure with laser light in the infrared region.

Examples of the method for forming a hydrophilic/hydrophobic region include a method of writing with heating or irradiation of a radiation ray, such as exposure. For example, light irradiation with an infrared laser, an ultraviolet ray lamp or visible light, electron beam irradiation, such as γ-ray, and thermal recordation with a thermal head can be carried out. Examples of the light source therefor include a mercury lamp, a metallic halide lamp, a xenon lamp, a chemical lamp and a carbon arc lamp. Examples of the radiation ray include an electron beam, X-ray, an ion beam and a far infrared ray. A high energy beam (laser beam) is also used.

Preferred examples of a specific embodiment that is generally employed include direct local recordation with a thermal recording head, scanning exposure with an infrared laser, high illuminance flash exposure, for example, with a xenon discharge lamp, and exposure with an infrared ray lamp.

In order to carry out direct pattern formation with digital data from a computer, a method of carrying out polarity conversion with laser exposure is preferred. Examples of the laser include a gas laser, such as a carbon dioxide gas laser, a nitrogen laser, an Ar laser, a He/Ne laser, a He/Cd laser and a Kr laser, a liquid (dye) laser, a solid state laser, such as a ruby laser and a Nd/YAG laser, a semiconductor laser, such as a GaAs/GaAlAs laser and an InGaAs laser, and an excimer laser, such as a KrF laser, a XeCl laser, a XeF laser and an $Ar_2$ laser. Among these, a semiconductor laser and a solid high output infrared laser, such as a YAG laser, emitting an infrared ray having a wavelength of from 700 to 1,200 nm are preferably used.

3C-2. Substrate and Electrode

The substrate and the first and second electrodes in the embodiment are appropriately selected from the constitution of the organic EL element. Specifically, the same materials as in the substrate and the first and the second electrode exemplified in "3A-2. Substrate and Electrode" can be exemplified.

3C-3. Organic Compound Layer

Examples of the organic compound layer (the organic light emitting layer, the constitution of the organic compound layer and the formation of the organic compound layer) include the same materials and the same constitutions as described in "3A-3. Organic Compound Layer".

3D. Organic EL Element of Fourth Embodiment

The organic EL element of the fourth embodiment will be described.

The fourth embodiment of an organic EL element of the invention is preferably an organic EL element of the second embodiment, in which the hydrophilic region formed on the first electrode is formed by local irradiation of a radiation ray on a surface having been in contact with a hydrophilic compound having a polymerizable group.

3D-1. Hydrophilic Region

The hydrophilic region in this embodiment will be described in detail.

3D-1-1. Formation of Hydrophilic Region by Surface Graft

In this embodiment, a surface is made in contact with a hydrophilic compound having a polymerizable group arranged on the substrate material, and energy is applied to the surface to form a chemical bond between the polymerizable group of the hydrophilic compound and the substrate material, whereby a hydrophilic region that is firm and excellent in durability and has high hydrophilicity is formed. The formation of the bond is referred to as surface graft.

This is equivalent to the surface graft polymerization described for the third embodiment. In the third embodiment, the polymer compound to be grafted has the polarity conversion group, and in this embodiment, a composition containing a polymerizable hydrophilic compound is made in contact with the surface, and it is directly bonded to an active species formed on the surface of the substrate material.

The contact can be carried out by immersing the substrate into a liquid composition containing the polymerizable hydrophilic compound, but it is preferred as described later that a layer mainly containing a composition containing a polymerizable hydrophilic compound is formed on the surface of the substrate material by a coating method from the standpoint of handleability and production efficiency.

The surface of the substrate material referred in the embodiment means a surface having such a function that the hydrophilic compound having a polymerizable group can be chemically bonded thereto. The substrate material itself may have such surface characteristics, or in alternative, it is possible that another layer (a layer exhibiting a polymerization initiating function described later) is separately provided on the substrate material, and the layer has such surface characteristics.

The formation of the surface graft by application of energy will be described below.

The formation of the hydrophilic region in this embodiment is carried out by such a method that is referred to as surface graft polymerization. The graft polymerization is such a method that active species are imparted on a polymer compound chain by applying energy by the known method, such as light and an electron beam, and another monomer capable of initiating polymerization with the active species is polymerized to synthesize a graft polymer, and particularly, in the case where the polymer compound, to which the active species are imparted, forms a surface, the method is referred to as surface graft polymerization.

In general, it is preferred that the surface of the substrate material or the layer exhibiting a polymerization initiating function is directly treated with plasma or an electron beam to generate a radical on the surface and to exhibit the polymerization initiating function, and thereafter, the active surface is reacted with a monomer having a hydrophilic functional group to form a graft polymer surface layer, i.e., a surface layer having the hydrophilic group.

As the method for inducing graft polymerization, for example, by irradiation of light, the known method can be applied.

Specific examples of the photo-graft polymerization method that can be used in the invention include the methods described in JP-A Nos. 63-92658, 10-296895 and 11-119431. Specifically, a polymerizable composition containing a polymerization initiator and a polymerizable compound is previously undercoated on the substrate material, and the hydrophilic compound having a polymerizable group is coated thereon, followed by irradiation of light.

As another method for forming the hydrophilic region, such a method described in T. Matsuda and Y. Nakayama, *Langmuir*, vol. 15, p. 5560 (1999) and *Macromolecules*, vol. 29, p. 8622 (1996) that a hydrophilic monomer is made in contact with a polymer substrate having an N,N-diethylthiocarbamate group, which is then locally exposed, so as to cause surface graft polymerization, whereby a hydrophilic pattern having polyacrylic acid fixed on the surface.

In the embodiment, the photo-graft method, in which energy application is effected by irradiation of light, is preferably used among the methods for producing the surface graft.

(Hydrophilic Compound having Polymerizable Group)

The hydrophilic compound having a polymerizable group used in the embodiment means a hydrophilic compound containing a radically polymerizable group formed by introducing an ethylenic addition-polymerizable unsaturated group, such as a vinyl group, an allyl group and a (meth)acryl group, as a polymerizable group into a hydrophilic homopolymer or copolymer obtained by using a hydrophilic monomer described later or using at least one kind selected from the hydrophilic monomers. In particular, those having the polymerizable group at an end thereof are preferred, and those having the polymerizable group at an end and a side chain thereof are further preferred.

The hydrophilic compound containing a radically polymerizable group having an ethylenic addition-polymerizable unsaturated group can be synthesized in the following manner.

Examples of the synthesis method include a method of copolymerizing a hydrophilic monomer and a monomer having an ethylenic addition-polymerizable unsaturated group; a method of copolymerizing a hydrophilic monomer and a monomer having a double bond precursor, and introducing a double bond by a treatment with a base; and a method of reacting a functional group of the hydrophilic compound with a monomer having an ethylenic addition-polymerizable unsaturated group. Among these, the method of reacting a functional group of the hydrophilic compound with a monomer having an ethylenic addition-polymerizable unsaturated group is particularly preferred from the standpoint of synthesis suitability.

Examples of the hydrophilic monomer used for synthesizing the hydrophilic compound having a radically polymerizable group at an end of the main chain and/or a side chain include a monomer having a hydrophilic group, e.g., a carboxyl group, a sulfone group, a phosphoric acid group, an amino group, a salt of them, a hydroxyl group, an amide group and an ether group, such as (meth)acrylic acid and an alkali metal salt or an amine salt thereof, itaconic acid and an alkali metal salt or an amine salt thereof, 2-hydroxyethyl (meth)acrylate, (meth)acrylamide, N-monomethylol (meth)acrylamide, N-dimethylol (meth)acrylamide, acrylic amine and a hydrogen halide salt thereof, 3-vinylpropionic acid and an alkali metal salt or an amine salt thereof, vinylsulfonic acid and an alkali metal salt or an amine salt thereof, 2-sulfoethyl (meth)acrylate, polyoxyethylene glycol (meth)acrylate, 2-acrylamide-2-methylpropanesulfonic acid and acid phosphoxypolyoxyethylene glycol mono(meth)acrylate.

Examples of the allyl group-containing monomer to be copolymerized with the hydrophilic monomer include ally (meth)acrylate and 2-allyloxyethyl methacrylate.

Examples of the monomer having a double bond precursor include 2-(3-chloro-1-oxopropoxy)ethyl methacrylate.

Examples of the monomer having a addition-polymerizable unsaturated group used for introducing an unsaturated group by utilizing reaction with the functional group, such as a carboxyl group, an amino group, a salt thereof, a hydroxyl group and an epoxy group, in the hydrophilic monomer include (meth)acrylic acid, glycidyl (meth)acrylate, allyl glycidyl ether and 2-isocyanatoethyl (meth)acrylate.

Preferred examples of the hydrophilic compound having a polymerizable group at an end and/or a side chain include a hydrophilic macromonomer. As the production process of the hydrophilic macromonomer used in the invention, various kinds of production methods are proposed, for example, in "Macromonomer no Kagaku to Kogyo" (Chemistry and Industry of Macromonomers), by Yamashita, et al., published by IPC, Ltd. (Sep. 20, 1989), chapter 2 "Macromonomer no Gosei" (Synthesis of Macromonomer). Examples of the hydrophilic macromonomer that is particularly useful in the invention include a macromonomer derived from a monomer containing a carboxyl group, such as acrylic acid and methacrylic acid, a sulfonic acid series macromonomer derived from a monomer, such as 2-acrylamide-2-methylpropanesulfonic acid, vinylstyrenesulfonic acid and a salt thereof, an amide series macromonomer derived from a monomer, such as (meth)acrylamide, N-vinylacetamide, N-vinylformamide and N-vinylcarboxylic acid amide, a macromonomer derived from a monomer containing a hydroxyl group, such as hydroxyethyl methacrylate, hydroxyethyl acrylate and glycerol monomethacrylate, and a macromonomer derived from a monomer containing an alkoxy group or an ethylene oxide group, such as methoxyethyl acrylate, methyoxypolyethylene glycol acrylate and polyethylene glycol acrylate. A monomer having a polyethylene glycol chain or a polypropylene glycol chain can be usefully used as the macromonomer in the invention.

The molecular weight of the macromonomer is preferably in a range of from 250 to 100,000, and particularly preferably in a range of from 400 to 30,000.

(Hydrophilic Monomer Useful for Combination Use with Hydrophilic Macromonomer)

A hydrophilic monomer may be further added to the hydrophilic macromonomer having a polymerizable group. The polymerization ratio can be increased by adding a hydrophilic monomer.

The addition amount of the hydrophilic monomer is preferably from 0 to 60% by mass in terms of solid content based on the total hydrophilic compound having a polymerizable group. When the amount exceeds 60% by weigh, it is not suitable because the coating property is deteriorated to fail to carry out uniform coating.

Examples of the hydrophilic monomer that is useful for using in combination with the hydrophilic compound having a polymerizable group at an end and/or a side chain thereof include a monomer having a positive charge, such as ammonium and phosphonium, and a monomer having a negative charge or an acidic group capable of being dissociated to a negative charge, such as a sulfonic acid group, a carboxylic acid group, a phosphoric acid group and a phosphonic acid group. Among these, a hydrophilic monomer having a nonionic group, such as a hydroxyl group, an amide group, a sulfonamide group, an alkoxy group and a cyano group, may also be used.

Specific examples of the hydrophilic monomer that is particularly useful for using in combination with the hydrophilic macromonomer in the embodiment include the following monomers.

Examples of the hydrophilic monomer include (meth) acrylic acid and an alkali metal salt or an amine salt thereof, itaconic acid and an alkali metal salt or an amine salt thereof, allylamine and a hydrogen halide acid salt thereof, 3-vinylpropionic acid and an alkali metal salt or an amine salt thereof, vinylsulfonic acid and an alkali metal salt or an amine salt thereof, styrenesulfonic acid and an alkali metal salt or an amine salt thereof, 2-sulfoethylene (meth)acrylate, 3-sulfopropylene (meth)acrylate and an alkali metal salt or an amine salt thereof, 2-acrylamide-2-methylpropanesulfonic acid and an alkali metal salt or an amine salt thereof, acid phosphoxypolyoxyethylene glycol mono(meth)acrylate and a salt thereof, 2-dimethylaminoethyl (meth)acrylate and a hydrogen halide acid salt thereof, 3-trimethylammoniumpropyl (meth) acrylate, 3-trimethylammoniumpropyl (meth)acrylamide and N,N,N-trimethyl-N-(2-hydroxy-3-methacryloyloxypropyl)ammonium chloride.

Furthermore, 2-hydroxyethyl (meth)acrylate, (meth) acrylamide, N-monomethylol (meth)acrylamide, N-dimethylol (meth)acrylamide, N-vinylpyrrolidone, N-vinylacetamide, polyoxyethylene glycol mono(meth) acrylate, a monomer having an amino acid skeleton in the molecule, such as N-methacryloyloxyethylcarbamic acid aspartic acid, and a monomer having a sugar skeleton in the molecule, such as glycoxyethyl methacrylate are also useful.

A solvent used in a composition containing the hydrophilic compound is not particularly limited as far as the hydrophilic macromonomer and the hydrophilic monomer as the main components can be dissolved therein, and an aqueous solvent, such as water and a water soluble solvent, is preferably used. A mixture thereof and a solvent having a surface active agent added thereto are also preferred.

The water soluble solvent herein means a solvent that can be mixed with water at an arbitrary ratio, and examples thereof include an alcohol solvent, such as methanol, ethanol, propanol, ethylene glycol and glycerin, an acid, such as acetic acid, a ketone solvent, such as acetone, an amide solvent, such as formamide.

The surface active agent, which can be added to the solvent depending on necessity, may be those that can be dissolved in the solvent, and examples thereof include an anionic surface active agent, such as sodium n-dodecylbenzenesulfonate, a cationic surface active agent, such as n-dodecyltrimethylammonium chloride, and a nonionic surface active agent, such as polyoxyethylene nonylphenyl ether (examples of a commercially available product therefor include EMULGEN 910, produced by Kao Corp.), polyoxyethylene sorbitan monolaurate (examples of a commercially available product therefor include TWEEN 20, produced by Yakuri Pure Chemicals Co., Ltd.).

In the case where the composition is in a liquid form is made in contact the surface, the operation may be arbitrarily carried out, and in the case where a coating layer of the hydrophilic compound composition is formed by a coating method, the coating amount is preferably from 0.1 to 10 $g/m^2$, and particularly preferably from 1 to 5 $g/m^2$, in terms of solid content. In the case where the coating amount is less than 0.1 $g/m^2$, there are some cases where sufficient hydrophilicity cannot be obtained, whereas when it exceeds 10 $g/m^2$, a uniform coating film is difficult to be obtained, and thus both the cases are not preferred.

3D-1-2. Formation of Hydrophilic/Hydrophobic Region

In the embodiment, the surface having been in contact with the hydrophilic compound having a polymerizable group can be locally irradiated with a radiation ray to form a hydrophilic/hydrophobic region. In other words, a hydrophilic region can be formed on the first electrode.

In the embodiment, the method for applying energy for forming a hydrophilic region is not particularly limited as far as the method can form an active point on the substrate material, and can apply energy capable of forming a bond between the active point and the hydrophilic compound having a polymerizable group, and a method of irradiating activation light is preferred from the standpoint of simplicity of the cost and the apparatus.

In the case where irradiation with activation light is applied to the local exposure, both scanning exposure based on digital data and pattern exposure using a lith film can be used.

As the method used for the pattern formation, the writing methods exemplified for the third embodiment can be preferably applied to this embodiment.

As a result of the application of energy, the active point generated on the substrate material is polymerized with the hydrophilic compound having a polymerizable group to form a surface having a hydrophilic graft chain having high mobility. In a preferred embodiment, a hydrophilic compound having a polymerizable group at an end and a side chain thereof is added, whereby the hydrophilic graft chain is bonded to the polymerizable group on the side chain of the graft chain bonded to the surface of the substrate material to form a graft chain having a branched structure. Thus, the hydrophilic graft having high mobility is exponentially improved in formation density and mobility, and therefore, higher hydrophilicity is exhibited.

3D-2. Substrate and Electrode

The substrate and the first and second electrodes in the embodiment are appropriately selected from the constitution of the organic EL element. Specifically, the same materials as in the substrate and the first and the second electrode exemplified in "3A-2. Substrate and Electrode" can be exemplified.

The surface of the substrate material (i.e., the substrate having at least the first electrode provided thereon) in the embodiment is not limited as far as it has such characteristics that are suitable for providing the surface graft through graft synthesis. In the embodiment, in view of effective generation of the active point and improvement in the sensitivity of the hydrophilic region formation, it is particularly preferred to form a layer having a polymerizable compound and a polymerization initiator added thereto as a compound exhibiting a polymerization initiating function through application of energy to the surface of the substrate material, i.e., to form a layer exhibiting a polymerization initiating function.

3D-2-1. Layer Exhibiting Polymerization Initiating Function

The layer exhibiting a polymerization initiating function (hereinafter, also referred to as a "polymerizable layer") can be formed in such a manner that the necessary components are dissolved in a solvent capable of dissolving the components and provided on the surface of the substrate material by coating, and the coated film is then hardened by heating or irradiation of light.

Details of the polymerizable compound and the polymerization initiator contained in the polymerizable layer, and the solvent used upon coating may be the same as those described in "1-1-1. (a) Production Method of Surface Graft".

The coating amount in the case where the polymerizable layer is formed on the substrate material is preferably from 0.1 to 20 g/m$^2$, and more preferably from 1 to 15 g/m$^2$, in terms of weight after drying. When the coating amount is less than 0.1 g/m$^2$, the sufficient polymerization initiating function cannot be exhibited to make grafting of the hydrophilic compound insufficient, and thus there is a possibility that the desired hydrophilicity cannot be obtained. When the coating amount exceeds 20 g/m$^2$, there is such a tendency that the film property is deteriorated, and the film is liable to be peeled off. Therefore, both the cases are not preferred.

In the embodiment, the composition for forming the polymerizable layer is arranged on the surface of the substrate material, for example, by coating, and the solvent is removed to effect film formation, whereby the polymerizable layer is formed. At this time, it is preferred that the film is hardened by carrying out heating and/or irradiation of light. In particular, when the film is dried by heat and then preliminarily hardened by irradiation of light, it is preferred since the hardening of the polymerizable compound is previously carried out to a certain extent, whereby such a phenomenon can be effectively prevented that the polymerizable layer itself is peeled off after attaining graft of the hydrophilic compound. The reason why irradiation of light is used for the preliminary hardening is the same as having been described for the photopolymerization initiator.

The conditions of the heating temperature and the heating time can be selected in such a manner that the coating solvent is sufficiently dried. It is preferred from the standpoint of production suitability that the drying temperature is 100° C. or less, and the drying time is 30 minutes or less, and it is more preferred that the drying temperature is from 40 to 80° C., and the drying time is 10 minutes or less.

Upon irradiation of light to be carried out after the heat drying, a light source used for forming a hydrophilic/hydrophobic region can be used. It is preferred that the irradiation of light is carried out to such an extent that the polymerizable compound present in the polymerizable layer is partly radically polymerized but is not completely polymerized, from the standpoint of the formation of the hydrophilic layer and prevention of inhibition of the formation of the bond between the active point of the polymerizable layer and the graft chain formed by application of energy. The time of the irradiation of light is preferably 30 minutes or less while it varies depending on the intensity of the light source. As a target of the preliminary hardening, for example, the film remaining ratio after solvent washing is 10% or more, and the initiator remaining ratio after the preliminary hardening is 1% or more.

3D-3. Organic Compound Layer

Examples of the organic compound layer (the organic light emitting layer, the constitution of the organic compound layer and the formation of the organic compound layer) include the same materials and the same constitutions as described in "3A-3. Organic Compound Layer".

The organic EL element of the invention can be preferably applied to various fields, such as a display element, a display device, a backlight, electrophotography, an illumination light source, a recording light source, an exposure light source, a reading light source, a sign, a signboard, an interior and an optical communication device.

EXAMPLES

The invention will be described in detail with reference to the following examples, but the invention is not construed as being limited thereto.

[Visible Image Receiving Material]

Examples 1 and 2

A biaxially stretched polyethylene terephthalate film (A4100, produced by Toyobo Co., Ltd.) having a thickness of 188 μm was subjected to an oxygen glow discharge treatment by using a flat plate magnetron sputtering apparatus (CFS-10-EP70, produced by Shibaura Eletec Corp.) under the following conditions.

—Oxygen Glow Discharge Treatment Conditions—

| | |
|---|---|
| Initial vacuum pressure: | 1.2 × 10$^{-3}$ Pa |
| Oxygen pressure: | 0.9 Pa |
| RF glow discharge: | 1.5 kW, Treating time: 60 sec |

The film having been subjected to the glow discharge treatment was immersed in an aqueous solution of sodium styrenesulfonate (10% by mass) having been bubbled with nitrogen at 70° C. for 7 hours. The film having been immersed was then washed with water for 8 hours to obtain a visible image receiving material 1 (Example 1) having sodium styrenesulfonate in the form of a graft polymer on the surface.

The same procedures were repeated except that sodium styrenesulfonate was changed to acrylic acid to obtain a visible image receiving material 2 (Example 2) having acrylic acid in the form of a graft polymer on the surface.

Example 3

A composition for forming an intermediate layer having the following composition was coated on a biaxially stretched polyethylene terephthalate film (A3100, produced by Toyobo Co., Ltd.) having a thickness of 188 μm with a rod bar #8 and then dried at 80° C. for 2 minutes. The thus coated film was irradiated by using a 400 W high pressure mercury lamp (UVL-400P, produced by Riko Kagaku Sangyo Co., Ltd.) for 10 minutes to effect preliminary hardening.

—Composition for Intermediate Layer—

| | |
|---|---|
| Allyl methacrylate-methacrylic acid copolymer (molar ratio: 80/20, molecular weight: 100,000) | 4 g |
| Ethylene oxide-modified bisphenol A diacrylate (M210, produced by Toagosei Co., Ltd.) | 4 g |
| 1-Hydroxycyclohexyl phenyl ketone | 1.6 g |
| 1-Methoxy-2-propanol | 16 g |

The film was then immersed in an aqueous solution containing sodium styrenesulfonate (10% by mass) and sodium hypoiodite ($NaIO_4$, 0.01% by mass) and irradiated by using a 400 W high pressure mercury lamp under an argon atmosphere for 30 minutes. The film thus obtained through irradiation with light was sufficiently washed with ion exchanged water to obtain a visible image receiving material 3 having sodium styrenesulfonate in the form of a graft polymer on the surface.

Reference Example

The same polyethylene terephthalate film as used in Examples 1 and 2 having been subjected to no treatment was designated as a visible image receiving material 4 as a reference example.

[Evaluations]

1. Evaluation of Drying Speed of Ink

A droplet (10 µL) of an aqueous ink (aqueous solution of rose bengal, concentration: 10 mg/L) was dropped on the visible image receiving materials 1 to 4 of Examples 1 to 3 and Reference Example and squeezed with a rubber roller. A period of time (sec) until the ink was not blurred (i.e., a period of time required for drying) was measured. The results are shown in Table 1 below.

2. Evaluation of Ink Absorption Property

A droplet (10 µL) of the same aqueous ink dropped on the visible image receiving materials 1 to 4 of Examples 1 to 3 and Reference Example, and an area covered with the droplet was measured immediately after dropping and 15 minutes after dropping. An area ($mm^2$) where the droplet was spread (i.e., (area finally covered with droplet)—(area covered with droplet immediately after dropping)) was calculated. The results are shown in Table 1 below.

3. Evaluation of Ink Coloration

A droplet (10 µL) of the same aqueous ink dropped on the visible image receiving materials 1 to 4 of Examples 1 to 3 and Reference Example and squeezed with a rubber roller immediately after dropping. The color density of the part, on which the droplet was dropped and squeezed off, was measured in terms of transmission density by using a Macbeth transmission densitometer with a filter for red, and the result was compared with the density of the part that had not been squeezed with a rubber roller. The results are shown in Table 1 below.

4. Evaluation of Printing with Ink-jet Printing Apparatus

Characters were printed on the visible image receiving materials 1 to 4 of Examples 1 to 3 and Reference Example with an aqueous ink having the following composition by using an ink-jet recording apparatus (PIXEL SET, produced by Canon, Inc.), and images obtained were evaluated 2 hours after printing. The results are shown in Table 1 below.

—Composition of Aqueous Ink—

| | |
|---|---|
| Acid Red 87 (C.I. 45380) | 1.8 g |
| Glycol | 10 g |
| Ion exchanged water | 990 g |

TABLE 1

| | Evaluation of drying speed Period of time required for drying | Evaluation of absorption property Area droplet broadened | Evaluation of coloration property | |
|---|---|---|---|---|
| | | | Density squeezed with rubber roller | Density not squeezed with rubber roller |
| Example 1 | 3 sec | 0.08 $mm^2$ | 0.95 | 0.96 |
| Example 2 | 3 sec | 0.09 $mm^2$ | 0.92 | 0.94 |
| Example 3 | 2 sec | 0.07 $mm^2$ | 0.93 | 0.95 |
| Reference Example | 270 sec | 4.2 $mm^2$ unevenly broadened | 0.11 | 0.43 |

It was understood from Table 1 that the visible image receiving materials 1 to 3 according to the invention had the following features. The ink was not transferred even in a short period of time after printing, and thus the materials were excellent in drying speed. The ink showed substantially no broadening (blur), and thus the materials showed high absorption property. Excellent ink fixing property was obtained, and decrease in density due to squeezing was small. Furthermore, in the evaluation in printing by an ink-jet recording apparatus, an image having high sharpness without blue was formed, and a printed matter having a high density and excellent hue was obtained. Therefore, it was understood that the visible image receiving material of the invention could be suitably used for printing in a direct drawing mode.

In the case where the visible image receiving material 4 (polyethylene terephthalate film without surface treatment) as Reference Example was used, on the other hand, it was found that the film has substantially no affinity with the aqueous ink, and the material could not exert the function as a visible image receiving material in the result of the same evaluations as in Examples 1 to 3.

As described in the foregoing, according to the visible image receiving material of the invention, such a visible image receiving material can be provided that has high ink absorption property and high ink fixing property, and is excellent in coloring property of a colorant.

[Conductive Pattern Material]

Examples 4 and 5

<Production of Member Having Surface Hydrophilicity>

A biaxially stretched polyethylene terephthalate film (A4100, produced by Toyobo Co., Ltd.) having a thickness of 188 µm was subjected to an oxygen glow discharge treatment by using a flat plate magnetron sputtering apparatus (CFS-10-EP70, produced by Shibaura Eletec Corp.) under the following conditions.

—Oxygen Glow Discharge Treatment Conditions—

| | |
|---|---|
| Initial vacuum pressure: | $1.2 \times 10^{-3}$ Pa |
| Oxygen pressure: | 0.9 Pa |
| RF glow discharge: | 1.5 kW, Treating time: 60 sec |

The film having been subjected to the glow discharge treatment was immersed in an aqueous solution of sodium styrenesulfonate (10% by mass) having been bubbled with nitrogen at 70° C. for 7 hours. The film having been immersed was then washed with water for 8 hours to obtain a member having surface hydrophilicity A having sodium styrenesulfonate in the form of a graft polymer on the surface.

The same procedures were repeated except that sodium styrenesulfonate was changed to acrylic acid to obtain a member having surface hydrophilicity B having acrylic acid in the form of a graft polymer on the surface.

<Production of Conductive Pattern Material>

Onto the members having surface hydrophilicity A and B thus obtained, a conductive ink for ink-jet recording with no affinity with water having the following composition as a fluid was discharged in the form of particles having a diameter of 30 μm with an interval of 30 μm by using an ink-jet recording apparatus to form a conductive material layer, and thus conductive pattern materials of the invention were produced.

—Conductive Ink for Ink-jet Recording—

| | |
|---|---|
| Acrylic polymer | 10 g |
| (toluene solution, concentration: 40% by mass) | |
| Aluminum powder | 4 g |
| Conductive carbon black powder | 0.5 g |
| Xylene | 80 g |

Examples 6 and 7

Members having surface hydrophilicity C and D were produced in the same manner as in Examples 4 and 5.

Onto the members having surface hydrophilicity C and D thus obtained, the same conductive ink for ink-jet recording as used in Examples 4 and 5 was used as an ink for silk screen printing, and a conductive material layer was formed by silk screen printing to produce, and thus conductive pattern materials of the invention were produced.

As the screen, nylon monofilament X—XO, 420S was used, and a photosensitive material containing a diazo resin and polyvinyl alcohol was used.

The thickness of the conductive material layers after drying was 4 μm.

[Evaluation]

The conductive pattern materials thus obtained were evaluated for conductivity and wear resistance in the following manners.

1. Conductivity

The resulting conductive pattern materials were measured for surface resistivity by the four-probe method using LORESTA—FP (produced by Mitsubishi Chemical Corp.). The surface resistivities of the conductive pattern materials of Examples 3 and 4 were 0.1Ω per square, and those of the conductive pattern materials of Examples 5 and 6 were 0.02Ω per square. Thus, it was understood that the materials were excellent in conductivity.

2. Wear Resistance

The surface of the conductive pattern material having conductive fine particles adsorbed thereon was rubbed by using a cloth (BEMCOT, produced by Asahi Chemical Industry Co., Ltd.) moistened with water with hand for 30 time of reciprocation. After the rubbing operation, the surface thereof was observed with a transmission electron microscope (JEM-200CX, produced by JEOL Ltd.) in the same manner as in the foregoing at a magnification of 100,000. It was found in all the conductive pattern materials of Examples 4 to 7 that a dense bump structure ascribed to the conductive fine particles was observed only on the region where the conductive material layer were formed by adsorbing the fine particles as similar to the state before the rubbing operation, and thus it was confirmed that the dense bump structure on the surface was not impaired by the rubbing operation.

As described in the foregoing, according to the conductive pattern material of the invention, a minute pattern having high resolution can be obtained without any complicated process steps and expensive equipments even when it is applied to the formation of wiring with plural different materials, and such a conductive pattern material can be provided that can directly form a pattern on the substrate material based on digital data and has excellent conductivity and excellent durability with a wide application range.

[Organic EL Element]

Example 8

As shown in FIG. 1, ITO transparent pixel electrodes 102*a*, 102*b* and 102*c* were formed on a substrate 101 of a PET film (produced by Panac Kogyo Co., Ltd.) having a thickness of 188 μm by a photolithography technique. The transparent pixel electrodes 102*a*, 102*b* and 102*c* formed a pattern having a pitch of 100 μm and a thickness of 0.1 μm.

An $SiO_2$ insulating layer 103 was formed among the transparent pixel electrodes by a photolithography technique.

On the substrate material having the transparent pixel electrodes 102*a*, 102*b* and 102*c* and the $SiO_2$ insulating layer 103 formed thereon, the following photopolymerizable composition was coated with a spin coater and dried at 80° C. for 2 minutes. The thickness of the film obtained was 0.4 μm after drying. The film was irradiated by using a 400 W high pressure mercury lamp (UVL-400P, produced by Riko Kagaku Sangyo Co., Ltd.) for 10 minutes to effect preliminary hardening.

<Photopolymerizable Composition>

| | |
|---|---|
| Allyl methacrylate-methacrylic acid copolymer | 4 g |
| (molar ratio: 80/20, molecular weight: 100,000) | |
| Ethylene oxide-modified bisphenol A diacrylate | 4 g |
| (M210, produced by Toagosei Co., Ltd.) | |
| 1-Hydroxycyclohexyl phenyl ketone | 1.6 g |
| 1-Methoxy-2-propanol | 16 g |

The substrate material was then immersed in an aqueous solution containing sodium styrenesulfonate (10% by mass) and sodium hypoiodite (NaClO, 0.01% by mass) and irradiated by using a 400 W high pressure mercury lamp under an argon atmosphere for 30 minutes. The film thus obtained through irradiation with light was sufficiently washed with ion exchanged water to obtain a hydrophilic surface (hydrophilic graft layer) 104 having sodium styrenesulfonate grafted thereon.

A liquid containing a red organic EL material (red EL material liquid) shown below was printed on a region of the hydrophilic surface to be a red light emitting region by the ink-jet method. In the similar manner, a green organic EL material liquid was printed on a region of the hydrophilic surface to be a green light emitting region, and a blue organic EL material liquid was printed on a region of the hydrophilic surface to be a blue light emitting region, by the ink-jet method.

<Red Organic EL Liquid>

Cyanopolyphenylenevinylene precursor (produced by Cambridge Display Technologies, Inc.)

<Green Organic EL Liquid>

Polyphenylenevinylene precursor (produced by Cambridge Display Technologies, Inc.)

<Blue Organic EL Liquid>

Polyphenylenevinylene and polyalkylphenylene precursor (produced by Cambridge Display Technologies, Inc.)

After printing, it was dried at 60° C. for 20 minutes to form organic compound layers (organic light emitting layers) 105a, 105b and 105c corresponding to pixels of three colors.

Finally, an MgAg reflective electrode 106 as the second electrode was vapor-deposited to a thickness of 0.2 µm to obtain a full color EL element of the invention.

Comparative Example 1

A full color organic EL element of Comparative Example 1 was produced in the same manner as in Example 8 except that the photo-graft polymerization layer was not provided.

Example 9

Figure 2:
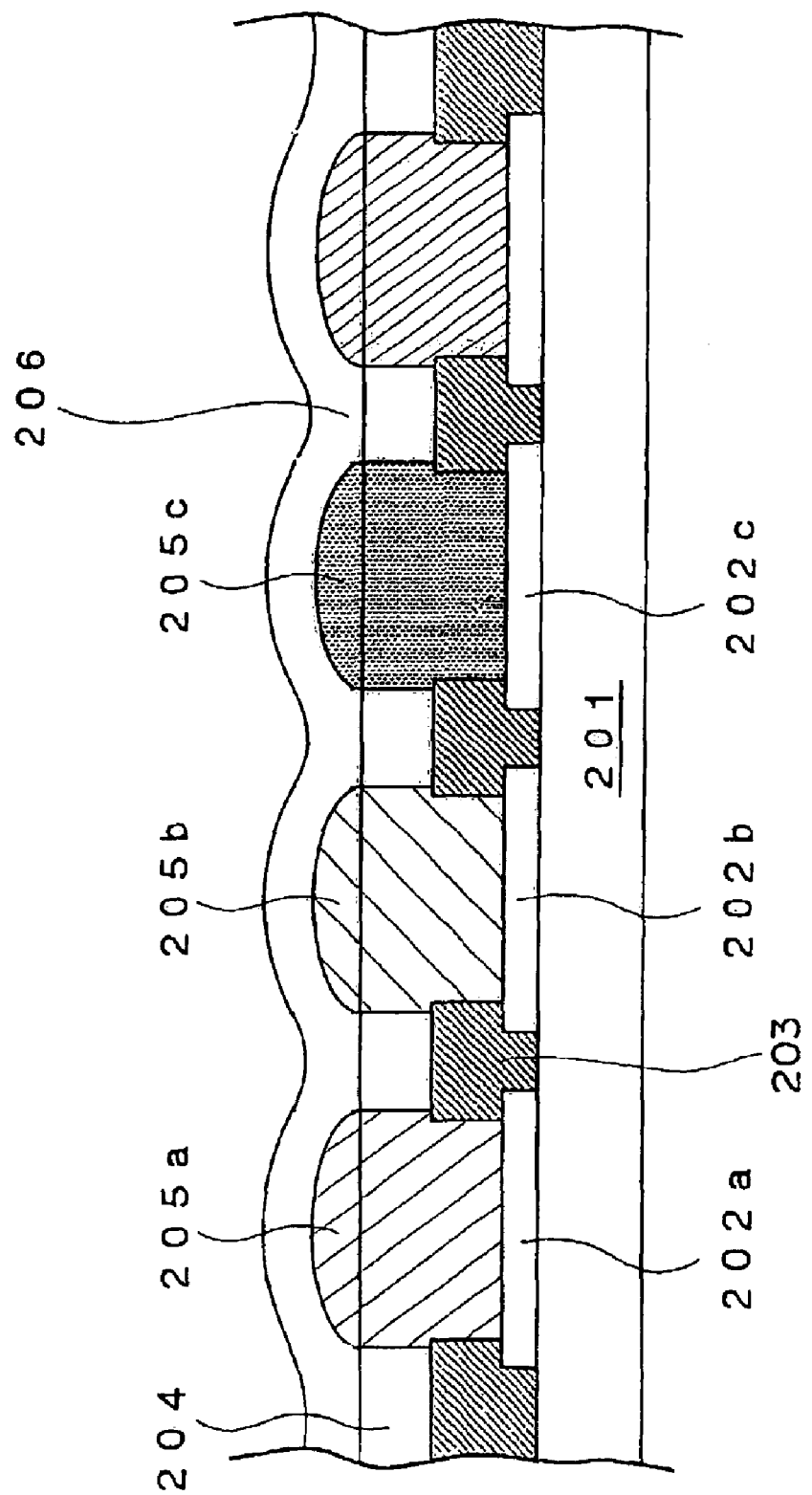
FIG. 2 is a schematic cross sectional view showing another example of the first embodiment of an organic electroluminescence element.

As shown in FIG. 2, ITO transparent pixel electrodes 202a, 202b and 202c were formed on a substrate 201 of quartz glass having a thickness of 1 mm by a photolithography technique in the same manner as in Example 8. The transparent pixel electrodes 202a, 202b and 202c formed a pattern having a pitch of 100 µm and a thickness of 0.1 µm.

Gaps among the transparent pixel electrodes 202a, 202b and 202c were filled with a resin black resist 203 to obtain a substrate material having a structure for a light shielding layer and prevention of dripping of an ink formed by photolithography. The black resist was adjusted to 40 µm for width and 1.0 µm for thickness.

Thereafter, a hydrophilic surface (hydrophilic graft layer) 204 was produced on the substrate material by using the same photopolymerizable composition as in Example 8.

The same red organic EL liquid as used in Example 8 was printed on a region of the hydrophilic surface to be a red light emitting region by a screen printing method using a silk screen pattern produced to transmit an ink in parts corresponding to the transparent pixel electrodes 202a, 202b and 202c on the substrate material 201. In the similar manner, the same green organic EL liquid as used in Example 8 was printed on a region of the hydrophilic surface to be a green light emitting region, and the same blue organic EL liquid as used in Example 8 was printed on a region of the hydrophilic surface to be a blue light emitting region, by the screen printing method.

Finally, an MgAg reflective electrode 206 was vacuum vapor-deposited to a thickness of 0.2 µm to obtain a full color EL element of the invention.

Comparative Example 2

A full color organic EL element of Comparative Example 2 was produced in the same manner as in Example 9 except that the hydrophilic graft layer 204 was not provided.

<Evaluation>

The full color organic EL elements of Examples 8 and 9 and Comparative Examples 1 and 2 were evaluated for sharpness and adhesion strength of the pixels by the evaluation methods and evaluation standards shown below. The results obtained are shown in Table 2.

1. Sharpness

—Evaluation Method—

The surface of the full color organic EL element was observed by a microscope, and the sharpness of the pixels was visually evaluated.

—Evaluation Standard—

A: The boundary between the organic compound layer and the surrounding region was sharp.

B: The organic compound layer blurred over the surrounding region, and the boundary was not clear.

2. Adhesion Strength

—Evaluation Method—

The surface of the full color organic EL element was cut to a grid pattern with an interval of 5 mm with a cutter knife with a load of 200 g. An adhesive tape having a polyester base and a width of 20 mm (NITTO TAPE, produced by Nitto Denko Corp.) was adhered on the cut pattern and then peeled off at a constant speed, and the degree of deletion of the EL layer (organic material layer) was then evaluated by observing with a microscope.

—Evaluation Standard—

A: Completely no peeling due to the tape test was observed.

B: Significant peeling due to the tape test was observed.

TABLE 2

|  | Sharpness | Adhesion strength |
| --- | --- | --- |
| Example 8 | A | A |
| Comparative Example 1 | B | B |
| Example 9 | A | A |
| Comparative Example 2 | B | B |

It was understood from the foregoing results that the organic EL element of Examples 8 and 9 were excellent in sharpness of the pixels and adhesion strength of the pixels.

Example 10

Figure 3:
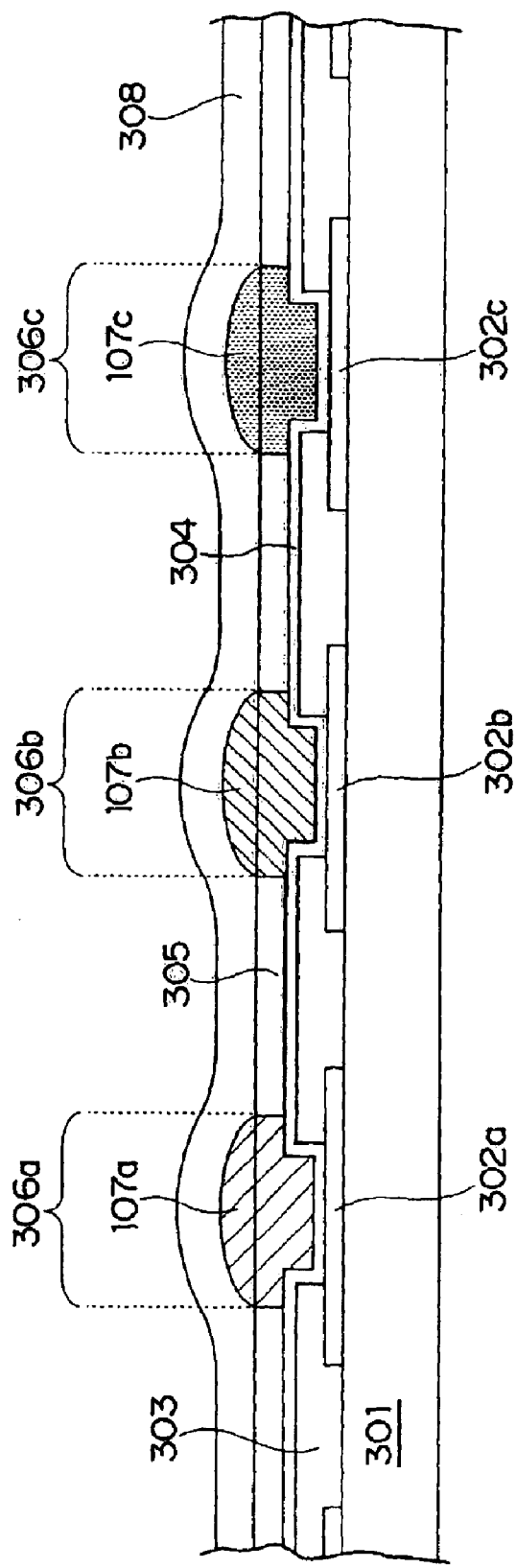
FIG. 3 is a schematic cross sectional view showing an example of the second embodiment of an organic EL element of the invention.

As shown in FIG. 3, ITO transparent pixel electrodes 302a, 302b and 302c as the first electrode were formed on a substrate 301 of a PET film (produced by Panac Kogyo Co., Ltd.) having a thickness of 388 µm by a photolithography technique. The transparent pixel electrodes 302a, 302b and 302c formed a pattern having a pitch of 100 µm and a thickness of 0.1 µm.

An $SiO_2$ insulating layer 303 was formed among the transparent pixel electrodes by a photolithography technique.

The substrate material having the transparent pixel electrodes 302a, 302b and 302c and the $SiO_2$ insulating layer 303 formed thereon was immersed in the following solution for 30 seconds and then taken out therefrom. The substrate was then dried in an oven at 80° C. for 1 minute and then subjected to preliminary hardening by irradiation of UV light (400 W high pressure mercury lamp, irradiation time: 10 minutes) to provide an intermediate layer 304 having a thickness of 0.05 µm.

<Composition for Intermediate Layer>

| | |
|---|---|
| Allyl methacrylate-methacrylic acid copolymer (molar ratio: 80/20, molecular weight: 100,000) | 1 g |
| Ethylene oxide-modified bisphenol A diacrylate (M210, produced by Toagosei Co., Ltd.) | 1 g |
| 1-Hydroxycyclohexyl phenyl ketone | 0.4 g |
| 1-Methoxy-2-propanol | 100 g |

Thereafter, the substrate material was immersed in the following composition for photo-graft polymerization in a glass vessel formed with PYREX, a registered trademark. The vessel was replaced with an Ar gas and irradiated by using a 400 W high pressure mercury lamp (UVL-400P, produced by Riko Kagaku Sangyo Co., Ltd.) with a distance between the glass vessel and the mercury lamp of 10 cm for 60 minutes. The substrate thus irradiated was then immersed in acetone for 30 minutes to remove a polymer that was not grafted on the surface, so as to form a surface having a monomer changing from hydrophobicity to hydrophilicity (graft layer) 305 on the surface of the substrate material.

<Composition for Photo-graft Polymerization>

| | |
|---|---|
| 2-Ethoxyethyl acrylate | 100 g |
| 1-Methoxy-2-propanol | 100 g |
| Benzophenone | 4.5 g |

The substrate was then immersed in a 10% by mass methyl ethyl ketone solution of 2,6-bistrichloromethyl-4-(p-(N,N-di(ethoxycarbonylmethyl)amino)phenyl)-triazine as a photo acid generating agent for 5 minutes.

A silver salt film for contact exposure was produced in such a manner that only the regions of the graft layer on the transparent pixel electrodes 302a, 302b and 302c were subjected to transmission exposure and was made in contact with the surface of the substrate material having the graft layer 305 formed thereon with accurate positioning. The assembly was irradiated by using a 400 W high pressure mercury lamp with a distance of 20 cm for 5 minutes. According to the procedures, only the regions of the graft layer on the transparent pixel electrodes 302a, 302b and 302c were made to have hydrophilicity, so as to form hydrophilic regions 306a, 306b and 306c.

A liquid containing a red organic EL material (red EL material liquid) shown below was printed on the hydrophilic light emitting region 306a by the ink-jet method. In the similar manner, a green organic EL material liquid was printed on the hydrophilic light emitting region 306b, and a blue organic EL material liquid was printed on the hydrophilic light emitting region 306c, by the ink-jet method.

<Red Organic EL Liquid>

Cyanopolyphenylenevinylene precursor (produced by Cambridge Display Technologies, Inc.)

<Green Organic EL Liquid>

Polyphenylenevinylene precursor (produced by Cambridge Display Technologies, Inc.)

<Blue Organic EL Liquid>

Polyphenylenevinylene and polyalkylphenylene precursor (produced by Cambridge Display Technologies, Inc.)

After printing, it was dried at 60° C. for 20 minutes to form organic compound layers (organic light emitting layers) 307a, 307b and 307c corresponding to pixels of three colors.

Finally, an MgAg reflective electrode 308 as the second electrode was vapor-deposited to a thickness of 0.2 μm to obtain a full color organic EL element of the invention.

Comparative Example 3

A full color organic EL element was produced in the same manner as in Example 10 except that the intermediate layer and the photo-graft polymerization layer were not provided.

Example 11

Figure 4:
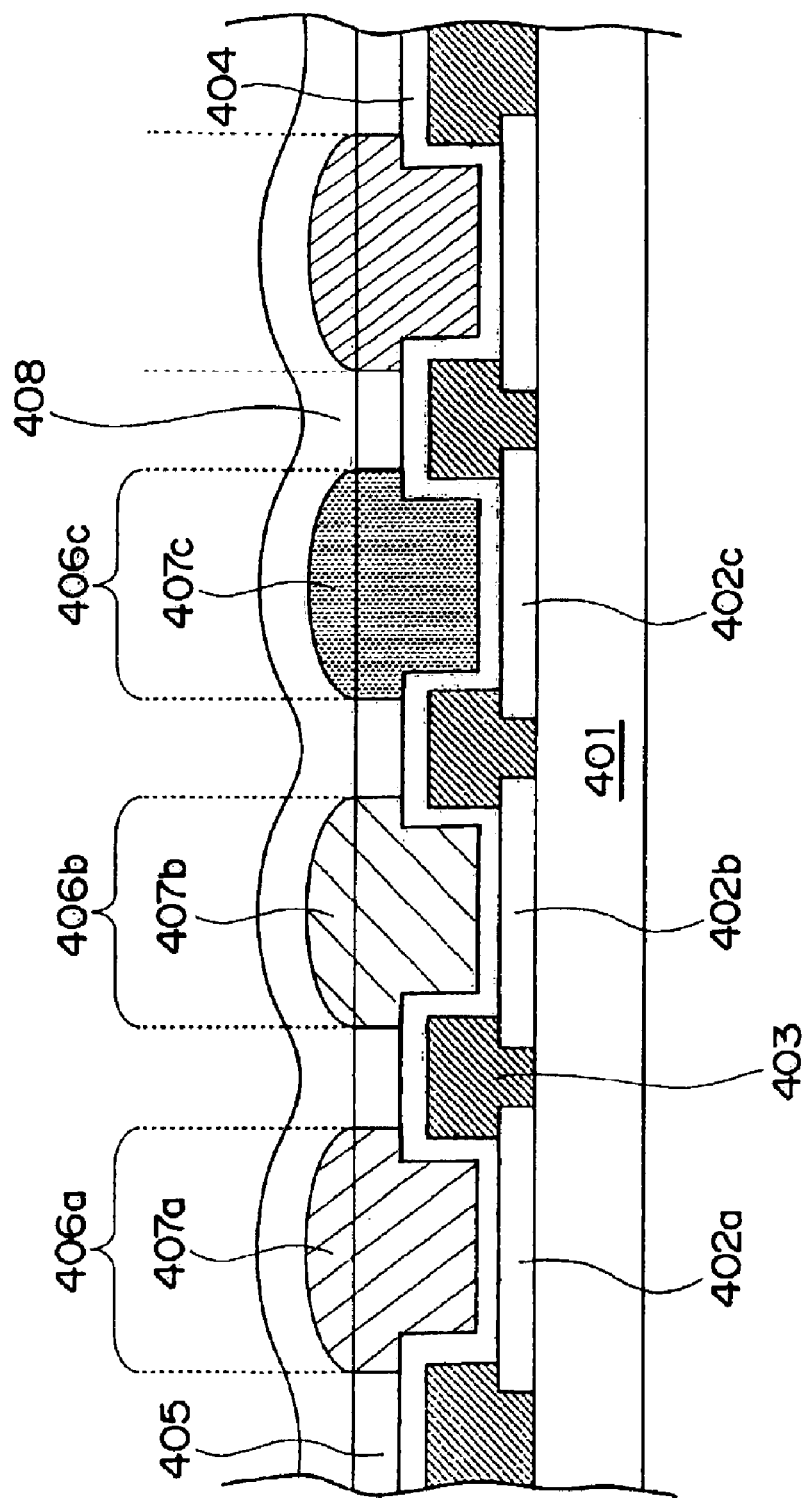
FIG. 4 is a schematic cross sectional view showing another example of the second embodiment of an organic electroluminescence element.

As shown in FIG. 4, ITO transparent pixel electrodes 402a, 402b and 402c as the first electrode were formed on a substrate 401 of quartz glass having a thickness of 1 mm by a photolithography technique in the same manner as in Example 10. The transparent pixel electrodes 402a, 402b and 402c formed a pattern having a pitch of 100 μm and a thickness of 0.1 μm.

Gaps among the transparent pixel electrodes 402a, 402b and 402c were filled with a resin black resist 403 to obtain a substrate material having a structure for a light shielding layer and prevention of dripping of an ink formed by photolithography. The black resist was adjusted to 40 μm for width and 1.0 μm for thickness.

Thereafter, an intermediate layer 404 and a graft surface (graft layer) 405 were produced on the substrate material by using the composition for forming an intermediate layer, the composition for photo-graft polymerization and the photo acid generating agent, which were the same as those as in Example 10.

Hydrophilic surfaces 406a, 406b and 406c were formed only on the regions of the graft layer 405 on the transparent pixel electrodes 402a, 402b and 402c in the same manner as in Example 10.

The same red organic EL liquid as used in Example 10 was printed on the hydrophilic surface 406a by a screen printing method using a silk screen pattern produced to transmit an ink in a region corresponding to the hydrophilic surface 406a.

The same green organic EL liquid as used in Example 10 was printed on the hydrophilic surface 406b, and the same blue organic EL liquid as used in Example 10 was printed on the hydrophilic surface 406c, respectively by a screen printing method in the same manner as the red organic EL liquid.

After printing, the substrate material was heated to 60° C. for 10 minutes to form organic compound layers (organic light emitting layers) 407a, 407b and 407c corresponding to pixels of three colors.

Finally, an MgAg reflective electrode 408 as the second electrode was vacuum vapor-deposited to a thickness of 0.2 μm to obtain a full color organic EL element of the invention.

Comparative Example 4

A full color organic EL element of Comparative Example 11 was produced in the same manner as in Example 11 except that the intermediate layer and the photo-graft polymerization layer were not provided.

Example 12

On a substrate material formed by providing ITO transparent pixel electrodes on the same PET film substrate as in Example 10, the following composition for forming a layer exhibiting a polymerization initiating function (polymerizable layer) was coated by using a rod bar #3 and dried at 80° C. for 2 minutes. The substrate having the composition for forming the polymerizable layer coated thereon was irradiated with UV light (400 W high pressure mercury lamp, irradiation time: 10 minutes) to effect preliminary hardening.

<Composition for Polymerizable Layer>

| | |
|---|---|
| Allyl methacrylate-methacrylic acid copolymer (molar ratio: 80/20, molecular weight: 100,000) | 4 g |
| Ethylene oxide-modified bisphenol A diacrylate (M210, produced by Toagosei Co., Ltd.) | 4 g |
| 1-Hydroxycyclohexyl phenyl ketone | 1.6 g |
| 1-Methoxy-2-propanol | 16 g |

An aqueous solution of sodium styrenesulfonate (30% by mass) was coated on the surface of the substrate material by using a rod bar #12, and a PET film having a thickness of 25 µm was laminated thereon without drying. A mask pattern having chromium deposited thereon to effect transmission exposure only on the region of the graft layer on the transparent electrodes was accumulated on the substrate material, and the assembly was irradiated with UV light from the above (400 W high pressure mercury lamp, irradiation time: 10 minutes). After the irradiation of light, the mask and the laminated film were removed and washing with water was carried out to form hydrophilic regions on which sodium styrensulforate has been grafted only on the transparent pixel electrodes.

The substrate material was then immersed in the same red organic EL liquid as used in Example 10, and thus the red organic EL liquid was selectively attached to the hydrophilic regions to form an organic compound layer.

Finally, an MgAg reflective electrode 408 as the second electrode was vacuum vapor-deposited to a thickness of 0.2 µm to obtain a full color organic EL element of the invention.

<Evaluation>

The full color organic EL elements of Examples 10, 11 and 12 and Comparative Examples 3 and 4 were evaluated for sharpness and adhesion strength of the pixels by the evaluation methods and evaluation standards shown below. The results obtained are shown in Table 3.

1. Sharpness

—Evaluation Method—

The surface of the full color organic EL element was observed by a microscope, and the sharpness of the pixels was visually evaluated.

—Evaluation Standard—

A: The boundary between the organic compound layer and the surrounding hydrophobic region was sharp.
B: The organic compound layer blurred over the surrounding hydrophobic region, and the boundary was not clear.

2. Adhesion strength

—Evaluation Method—

The surface of the full color organic EL element was cut to a grid pattern with an interval of 5 mm with a cutter knife with a load of 200 g. An adhesive tape having a polyester base and a width of 20 mm (NITTO TAPE, produced by Nitto Denko Corp.) was adhered on the cut pattern and then peeled off at a constant speed, and the degree of deletion of the EL layer (organic compound layer) was then evaluated by observing with a microscope.

—Evaluation Standard—

A: Completely no peeling due to the tape test was observed.
B: Significant peeling due to the tape test was observed.

TABLE 3

| | Sharpness | Adhesion strength |
|---|---|---|
| Example 10 | A | A |
| Comparative Example 3 | B | B |
| Example 11 | A | A |
| Comparative Example 4 | B | B |
| Example 12 | A | A |

It was understood from the foregoing results that the organic EL elements of Examples 10 to 12 were excellent in sharpness of the pixels and adhesion strength of the pixels.

According to the organic EL element of the invention, such an organic electroluminescence element can be provided that is excellent in sharpness and durability of pixels and can be conveniently subjected to uniform and local patterning.

What is claimed is:

1. An organic electroluminescence element comprising in the following order a substrate having a first electrode formed thereon, a hydrophilic surface having a hydrophilic graft chain provided on the substrate, an organic light emitting layer or plural organic compound layers including an organic light emitting layer locally provided on the hydrophilic surface, and a second electrode provided on the organic light emitting layer or the plural organic compound layers including an organic light emitting layer.

2. An organic electroluminescence element according to claim 1, wherein the hydrophilic surface comprises the hydrophilic graft chain bonded to a surface of the first electrode or a surface of an intermediate layer provided on the first electrode.

3. An organic electroluminescence element according to claim 1, wherein the hydrophilic graft chain is bonded to a surface of the first electrode or a surface of an intermediate layer provided on the first electrode at an end of the graft chain, and a graft portion exhibiting hydrophilicity is substantially not crosslinked.

4. An organic electroluminescence element according to claim 1, wherein the organic compound layer is formed by discharging a composition in a fluid form for forming the organic compound layer from an ink-jet recording head in a pattern using an ink-jet recording apparatus, to locally apply the composition to the hydrophilic surface.

5. An organic electroluminescence element comprising in the following order a substrate having a first electrode formed thereon, at least one organic compound layer including an organic light emitting layer, wherein the at least one organic compound is provided on a hydrophilic region after the hydrophilic region is formed on the first electrode by locally applying energy to a surface which is formed on the substrate and is capable of forming a hydrophilic/hydrophobic region by application of energy, and a second electrode provided on the organic compound layer.

6. An organic electroluminescence element according to claim 5, wherein the hydrophilic region is formed by application of heat, supply of an acid, or irradiation of a radiation ray on a surface having a polymer compound including a functional group whose hydrophilicity/hydrophobicity is changed by heat, an acid, or a radiation ray.

7. An organic electroluminescence element according to claim 6, wherein the functional group whose hydrophilicity/hydrophobicity is changed is at least one selected from the group consisting of a secondary alkylsulfonate ester group, a tertiary carboxylate ester group and an alkoxyalkyl ester group.

8. An organic electroluminescence element according to claim 5, wherein the hydrophilic region is formed by irradiation of a radiation ray on a surface having been in contact with a hydrophilic compound having a polymerizable group.

9. An organic electroluminescence element according to claim 8, wherein the hydrophilic region is formed on a layer containing a compound exerting a polymerization initiating function which layer is provided on the first electrode.

10. An organic electroluminescence element according to claim 5, wherein the organic compound layer is formed by discharging a composition in a fluid form for forming the organic compound layer from an ink-jet recording head in a pattern using an ink-jet recording apparatus, to locally apply the composition to the hydrophilic region.

11. A method for producing an organic electroluminescence element, the method comprising:

forming a first electrode on a substrate, forming a hydrophilic surface having a hydrophilic graft chain on the substrate having the first electrode formed thereon, forming an organic light emitting layer or plural organic compound layers including an organic light emitting layer locally provided on the hydrophilic surface, and forming a second electrode on the organic light emitting layer or the plural organic compound layers including an organic light emitting layer.

12. The method according to claim 11, wherein the organic compound layer is formed by discharging a composition in a fluid form for forming the organic compound layer from an ink-jet recording head in a pattern using an ink-jet recording apparatus, to locally apply the composition to the hydrophilic surface.

13. A method for producing an organic electroluminescence element, the method comprising:

forming a first electrode on a substrate, forming a surface having a polymer group having a functional group whose hydrophilicity/hydrophobicity is changed by heat, an acid, or a radiation ray on the substrate having the first electrode formed thereon, and applying heat, an acid or irradiation to the surface to change hydrophilicity and hydrophobicity of the surface, so as to form a hydrophilic region, forming at least one organic compound layer including an organic light emitting layer on the hydrophilic region, and forming a second electrode on the organic compound layer.

14. The method according to claim 13, wherein the organic compound layer is formed by discharging a composition in a fluid form for forming the organic compound layer from an ink-jet recording head in a pattern using an ink-jet recording apparatus, to locally apply the composition to the hydrophilic region.

15. A method for producing an organic electroluminescence element, the method comprising:

forming a first electrode on a substrate, forming a surface in contact with a hydrophilic compound having a polymerizable group on the substrate having the first electrode formed thereon, and irradiating the surface with a radiation ray to form a hydrophilic region on the first electrode, forming at least one organic compound layer including an organic light emitting layer on the hydrophilic region, and forming a second electrode on the organic compound layer.

16. The element of claim 1 wherein the hydrophilic surface is provided in direct physical contact with the substrate and the first electrode.

17. The element of claim 5 wherein the hydrophilic/hydrophobic region is provided in direct physical contact with the substrate and the first electrode.

* * * * *